(12) United States Patent
Kumar et al.

(10) Patent No.: US 8,737,161 B1
(45) Date of Patent: May 27, 2014

(54) WRITE-LEVELING SYSTEM AND METHOD

(71) Applicants: Arvind Kumar, Bangalore (IN);
Shobhit Singhal, Bangalore (IN); Vikas Lakhanpal, Karnataka (IN)

(72) Inventors: Arvind Kumar, Bangalore (IN);
Shobhit Singhal, Bangalore (IN); Vikas Lakhanpal, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/769,172

(22) Filed: Feb. 15, 2013

Related U.S. Application Data

(60) Provisional application No. 61/747,761, filed on Dec. 31, 2012.

(51) Int. Cl.
*G11C 8/00* (2006.01)
*G11C 7/22* (2006.01)
*G11C 7/10* (2006.01)

(52) U.S. Cl.
CPC .............. *G11C 7/22* (2013.01); *G11C 7/1051* (2013.01); *G11C 7/1072* (2013.01)
USPC .................. 365/233.1; 365/194; 365/230.06

(58) Field of Classification Search
USPC ............. 365/233.1, 233.13, 191, 194, 230.06
See application file for complete search history.

(56) References Cited

U.S. PATENT DOCUMENTS

| 5,577,049 | A  | * | 11/1996 | Ito ................................. 370/537 |
| 7,406,646 | B2 | * | 7/2008  | Sato et al. ...................... 714/744 |
| 7,586,800 | B1 | * | 9/2009  | Kornachuk .................... 365/196 |
| 8,103,917 | B2 | * | 1/2012  | Jang .............................. 714/700 |
| 2012/0166894 | A1 | * | 6/2012 | Jang .............................. 714/700 |

* cited by examiner

*Primary Examiner* — Gene Auduong
(74) *Attorney, Agent, or Firm* — John R. Pessetto; Wade J. Brady, III; Frederick J. Telecky, Jr.

(57) ABSTRACT

A system is provided for use with a DRAM, a DQS signal provider, a clock signal provider, a DQS line and a clock line. The DQS line can provide the DQS signal from the DQS signal provider to the DRAM. The clock line can provide the clock signal from the clock signal provider to the DRAM. The system includes a clock delay determining portion, a DQS delay determining portion, and adjustment portion and a controlling portion. The clock delay determining portion can determine a clock delay. The DQS delay determining portion can determine a DQS delay. The adjustment portion can generate an adjustment value based on the clock delay and the DQS delay. The controlling portion can instruct the DQS signal provider to adjust a time of providing a second DQS signal based on the adjustment value, wherein the clock delay is less than the DQS delay.

14 Claims, 18 Drawing Sheets

WRITE-LEVELING SYSTEM AND METHOD

The present application claims priority from U.S. Provisional Application No. 61/747,761, filed Dec. 31, 2012, the entire disclosure of which is incorporated herein by reference.

BACKGROUND

The present invention relates to next generation Double Data Rate (DDR) Synchronous Dynamic Random-Access Memories (SDRAMs); specifically DDR3 and DDR4 SDRAMs. The new generation DDR3 and DDR4 technologies operate at lower power, run at higher speeds, offer at least two-times the bandwidth, and are packed with denser circuitry than the preceding technology DDR2. The high speed and high efficiency of the DDR3 and DDR4 technology places high demand on any memory controller, in a System on a Chip (SoC). DDR3 and DDR4 interfaces require board system speeds in excess of 400 MHz that requires a new fly-by-topology be adopted to provide better signal integrity at higher speeds.

Older DDR2 technologies used a T-branch Topology. T-branch Topology required a high number of data lines going from the memory controller directly to each DRAM; this caused the clock's signal arriving time to all DRAMs on a DIMM to be roughly the same.

The new DDR3 and DDR4 fly-by topology allows the fly-by signals of command, control, and clock signals to be connected in series with each DRAM Device. This connection in series causes a delay for signals sent to each DRAM on a DIMM that is unique and different. This will now be described with reference to FIGS. 1-2.

FIG. 1 illustrates an example conventional SDRAM circuit 100.

As illustrated in the figure, conventional SDRAM circuit 100 includes a DIMM 102 and a controller 104. DIMM 102 includes a Dynamic Random-Access Memory (DRAM) 106, a DRAM 108, a DRAM 110, a DRAM 112, a DRAM 114, a DRAM 116, a DRAM 118 and a DRAM 120.

Controller 104 receives instructions from a processor (not shown) via signal line 122. Accordingly, the processor may store and retrieve data within SDRAM circuit 100. However, before storage and retrieval may be performed, DIMM 102 must be calibrated, which is the basis of the discussion herein. As such, there will be no further discussion with respect to storage and retrieval of data by the processor via signal line 122.

Controller 104 provides fly-by instructions via clock (CK) line 124 to DIMM 102. Controller 104 reads and writes data from each of DRAMs 106, 108, 110, 112, 114, 116, 118 and 120 via DQ lines (indicated by dashed arrows) 126, 128, 130, 132, 134, 136, 138 and 140, respectively. Controller provides data strobe signals to each of DRAMs 106, 108, 110, 112, 114, 116, 118 and 120 via DQS lines (indicated by solid arrows) 142, 144, 146, 148, 150, 152, 154 and 156, respectively.

It should be noted that each of a CK line and a DQS line discussed herein is actually a differential pair, which is a pair of tightly coupled carriers, one of these carrying the signal, the other carrying an equal but opposite image of the signal. Accordingly, a CK line is actually a CK line carrying the signal and a CK#line carrying an equal but opposite image of the signal. Similarly, a DQS line is actually a DQS line and a DQS#line.

Controller 104 provides fly-by instructions via clock (CK) line 124 to each of DRAMs 106, 108, 110, 112, 114, 116, 118 and 120 DRAM 108 via line 124. The path length of line 124 increases as it travels from DRAM 106 through DRAM 120. This increased path length is indicated as sections 174, 176, 178, 180, 182, 184, 186 and a terminal end 188. In particular, DRAM 108 is arranged to receive fly-by instructions from controller 104 via line 124, but with a path length that is longer than the path length as provided to DRAM 106 by an amount indicated by section 174. DRAM 110 is arranged to receive fly-by instructions from controller 104 via line 124, but with a path length that is longer than the path length as provided to DRAM 108 by an amount indicated by section 176. DRAM 112 is arranged to receive fly-by instructions from controller 104 via line 124, but with a path length that is longer than the path length as provided to DRAM 110 by an amount indicated by section 178. DRAM 114 is arranged to receive fly-by instructions from controller 104 via line 124, but with a path length that is longer than the path length as provided to DRAM 112 by an amount indicated by section 180. DRAM 116 is arranged to receive fly-by instructions from controller 104 via line 124, but with a path length that is longer than the path length as provided to DRAM 114 by an amount indicated by section 182. DRAM 118 is arranged to receive fly-by instructions from controller 104 via line 124, but with a path length that is longer than the path length as provided to DRAM 116 by an amount indicated by section 184. DRAM 120 is arranged to receive fly-by instructions from controller 104 via line 124, but with a path length that is longer than the path length as provided to DRAM 118 by an amount indicated by section 186. The CK line terminates at termination 188.

For each DRAM, controller 104 is able to access data stored therein via a DQ line, e.g., controller 104 may access data in DRAM 106 via DQ line 126. In order to write data into a DRAM, controller 104 sends data via a DQ line, and along with data, controller 104 sends a strobe pulse via the DQS line so that it can be captured by the DRAM. But there is one requirement from the DRAM side that CK line 124 must be properly aligned with the DQS pulse as provided in DQS line 142.

Properly aligning a CK pulse with a DQS pulse for DRAM 106 is a rudimentary procedure. However, properly aligning a CK pulse with a DQS pulse for the remaining DRAMs, respectively, may be a little more complex. In particular, in CK line 124, each of the extra path lengths indicated by sections 174, 176, 178, 180, 182, 184, 186 and 188 may have different parameters, e.g., lengths, which would provide somewhat different delays in the clock pulses as they travel from controller 104 through each DRAM to termination 188.

To compensate for the delay difference, write-leveling techniques are used. Controller 104 ensures the calibration is done automatically. During write-leveling, controller 104 compensates for the difference between the CK signal and the DQS signal to each DRAM, respectively, on DIMM 102. This difference the CK signal and the DQS signal to a DRAM, is the flight-time skew for that DRAM. As mentioned above, this flight-time skew is different for each DRAM, and is therefore uniquely adjusted for each.

Controller 104 adjusts for the flight-time skew by incrementally delaying the DQS signal one step at a time and until a transition from 0 to 1 is detected on the CK signal on destination DRAM. This realigns DQS and CK signals so that the data on DQ line is captured reliably.

Write-leveling to compensate for flight-time skew will now be further discussed with reference to FIG. 2.

FIG. 2 illustrates example clock signals and DQS signals provided to DRAM 114 of FIG. 1.

FIG. 2 includes a source CK signal 202, a source DQS signal 204, a destination CK signal 206, a destination DQS signal 208 and an aligned DQS signal 210.

Source CK signal 202 corresponds to the CK signal leaving controller 104 via CK line 124 after having traveled through extended paths indicated by sections 174, 176, 178 and 180. Source DQS signal 204 corresponds to the DQS signal leaving controller 104 via DQS line 150. Destination CK signal 206 corresponds to the CK signal arriving at DRAM 114 via CK line 124 after having traveled through extended paths indicated by sections 174, 176, 178 and 180. Destination DQS signal 208 corresponds to the DQS signal arriving at DRAM 114 via DQS line 150. It should be noted that the destination CK signal and the DQS signal may correspond to those arriving at any one of the DRAMs. Clearly each DRAM will have a different flight-time skew. In this example, aligned DQS signal 210 corresponds to a subsequently transmitted modified DQS signal arriving at DRAM 114 via DQS line 150.

Source CK signal 202 includes a plurality of pulses, a representative of which is indicated as pulse 212. Pulse 212 includes a rising edge 214 and a falling edge 216.

Source DQS signal 204 includes a plurality of pulses, a representative of which is indicated as pulse 218. Pulse 218 includes a rising edge 220 and a falling edge 222.

Destination CK signal 206 includes a plurality of pulses, a representative of which is indicated as pulse 224. Pulse 224 includes a rising edge 226 and a falling edge 228.

Destination DQS signal 208 includes a plurality of pulses, a representative of which is indicated as pulse 230. Pulse 230 includes a rising edge 232 and a falling edge 234.

Aligned DQS signal 210 includes a plurality of pulses, a representative of which is indicated as pulse 242. Pulse 242 includes a rising edge 244 and a falling edge 246.

In this example, the delay of the CK signal from controller 104 to DRAM 114, is illustrated by arrow 236, whereas the delay of the DQS signal from controller 104 to DRAM 114 is illustrated by arrow 238. The DQS delay is less than the CK delay. In other words, the DQS signal arrives at DRAM 114 ahead of the CK signal. The difference between the DQS delay and the CK delay is the flight-time skew and, in this case, is less than one clock cycle.

Now that the flight-time skew is known, controller 104 may adjust subsequent DQS signals such that they are aligned with the CK signals, i.e., the DQS delay is the same as the CK delay. This is shown in aligned DQS signal 210. Here, rising edge 232 of pulse 230 corresponds to rising edge 244 of pulse 242 of a subsequent DQS signal. Rising edge 244 of pulse 242 matches rising edge 226 of pulse 206 of destination CK signal 206.

In conventional write-leveling systems, the flight-time skew for each DRAM is determined, respectively. Then subsequent DQS signals, for each DRAM, are modified to account for the flight-time skews, respectively. This is the conventional method for correcting flight-time skew by write leveling, when the difference between the DQS delay and the CK delay is less than one clock cycle.

The conventional methods of write-leveling fail to address situations where the DQS signal arrives after the CK signal. Further, conventional methods of write-leveling fail to address situations where the difference between the DQS delay and the CK delay is more than one clock cycle.

What is needed is a write-leveling system and method that addresses situations where the DQS signal arrives after the CK signal. Further, what is needed is a write-leveling system and method that addresses situations where the difference between the DQS delay and the CK delay is more than one clock cycle.

BRIEF SUMMARY

Aspects of the present invention provide a write-leveling system and method that addresses situations where the DQS signal arrives after the CK signal. Aspects of the present invention additionally provide a write-leveling system and method that addresses situations where the difference between the DQS delay and the CK delay is more than one clock cycle.

An aspect of the present invention is drawn to a system for use with a DRAM. The system includes a DQS signal generating portion, a clock signal generating portion, a delay determining portion, an adjustment portion and a controlling portion. The DQS signal generating portion can provide a DQS signal to the DRAM at a first time. The clock signal generating portion can provide a clock signal to the DRAM. The delay determining portion can receive a delay signal from the DRAM and can generate a delay value based on the received signal. The adjustment portion can generate an adjustment value based on the delay value. The DQS signal generating portion can provide a second DQS signal to the DRAM. The controlling portion can instruct the DQS signal generating portion to providing the second DQS signal at a second time based on the adjustment value, wherein the delay signal corresponds to the DRAM having received the DQS signal prior to receiving the clock signal.

Another aspect of the present invention is drawn to a system for use with a DRAM, wherein the system includes a DQS signal generating portion, a clock signal generating portion, a DQ portion, a delay determining portion, an adjustment portion and a controlling portion. The DQS signal generating portion can provide a first DQS signal to the DRAM for a first time period and can provide a second DQS signal to the DRAM for a second time period. The clock signal generating portion can provide a clock signal to the DRAM. The DQ portion can provide first DQ data to the DRAM during a third time period and can provide second DQ data to the DRAM during a fourth time period. The delay determining portion can read data from the DRAM after the fourth time period and can generate a delay value based on the received data. The adjustment portion can generate an adjustment value based on the delay value. The DQS signal generating portion can provide a third DQS signal to the DRAM. The controlling portion can instruct the DQS signal generating portion to provide the third DQS signal at a third time based on the adjustment value.

Additional advantages and novel features of the invention are set forth in part in the description which follows, and in part will become apparent to those skilled in the art upon examination of the following or may be learned by practice of the invention. The advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

A write-leveling system and method in accordance with aspects of the present invention enables write-leveling in situations where the CK signal arrives after the DQS signal. A write-leveling system and method in accordance with aspects of the present invention additionally enables write-leveling in situations where the DQS signal arrives after the CK signal (a negative flight-time skew), and in situations where the difference between the DQS delay and the CK delay is more than one clock cycle (a flight time skew greater than one clock cycle).

A write-leveling system and method in accordance with aspects of the present invention provides a two-stage leveling.

In the first stage, the absolute skew between a DQS rising edge and the CK rising edge is determined. In an example embodiment, this stage is performed by stepping a plurality of DQS pulses to identify a setup and hold window of a DRAM to locate the rising edge of the CK pulse.

In the second stage, it is determined which CK pulse was aligned with the DQS pulse in the first stage and then write-leveling is performed to align a DQS rising edge with the correct CK rising edge. In an example embodiment, a series of data values are consecutively written into the DRAM during a first time period. Then alternating data values are written into the DRAM during a second time period. The resulting data read from the DRAM will accurately indicate whether the flight-time skew is negative (the CK signal trials the DQS signal by more than a clock cycle), whether the CK and DQS signal are aligned (no flight-time skew), or the amount of the positive flight-time skew (how many cycles the DQS signal trails the CK signal).

Aspects in accordance with the present invention will now be described with reference to FIGS. 3-14.

Figure 3:
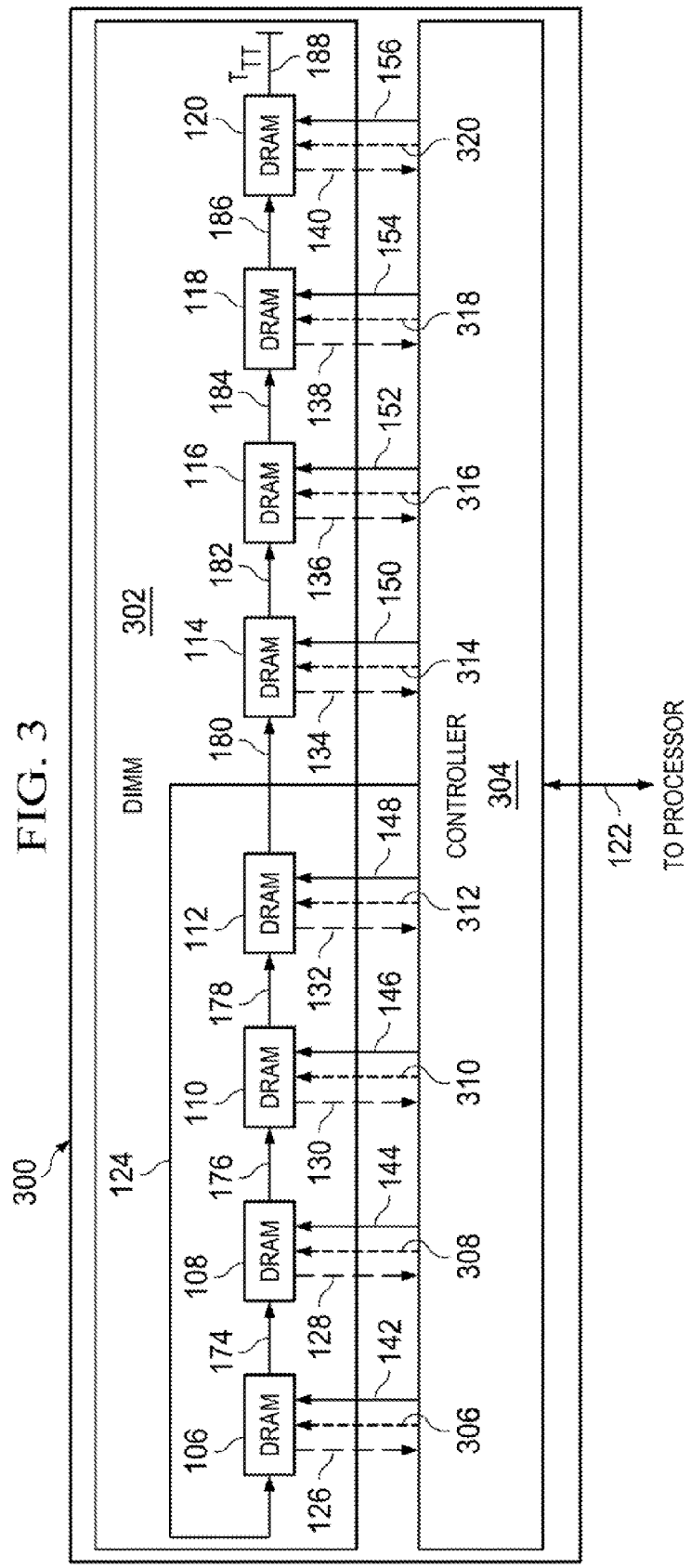
FIG. 3 illustrates an example DRAM circuit, in accordance with aspects of the present invention.

FIG. 3 illustrates an example SDRAM circuit 300, in accordance with aspects of the present invention.

As illustrated in the figure, SDRAM circuit 300 includes a DIMM 302 and a controller 304. DIMM 302 includes DRAMs 106, 108, 110, 112, 114, 116, 118 and 120.

Figure 1:
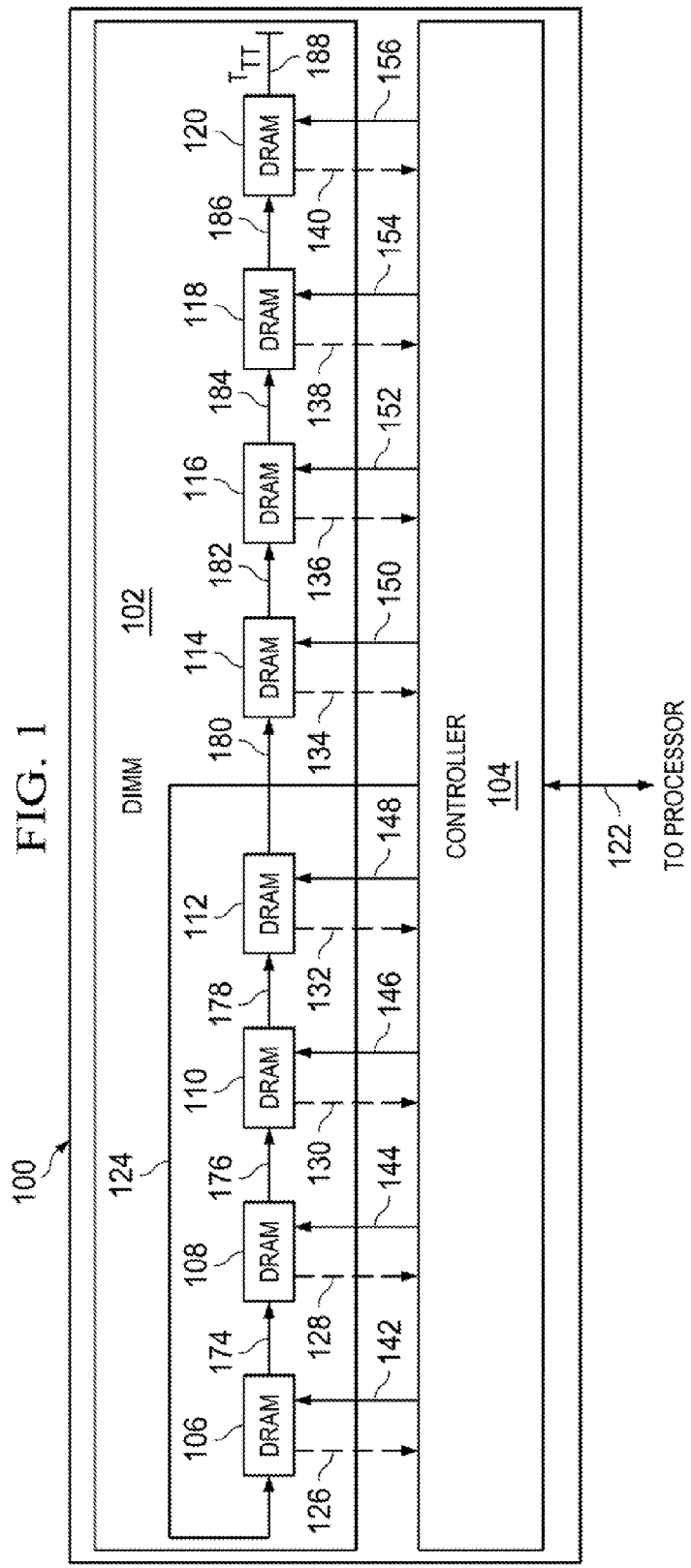
FIG. 1 illustrates an example conventional DRAM circuit.
Figure 2:
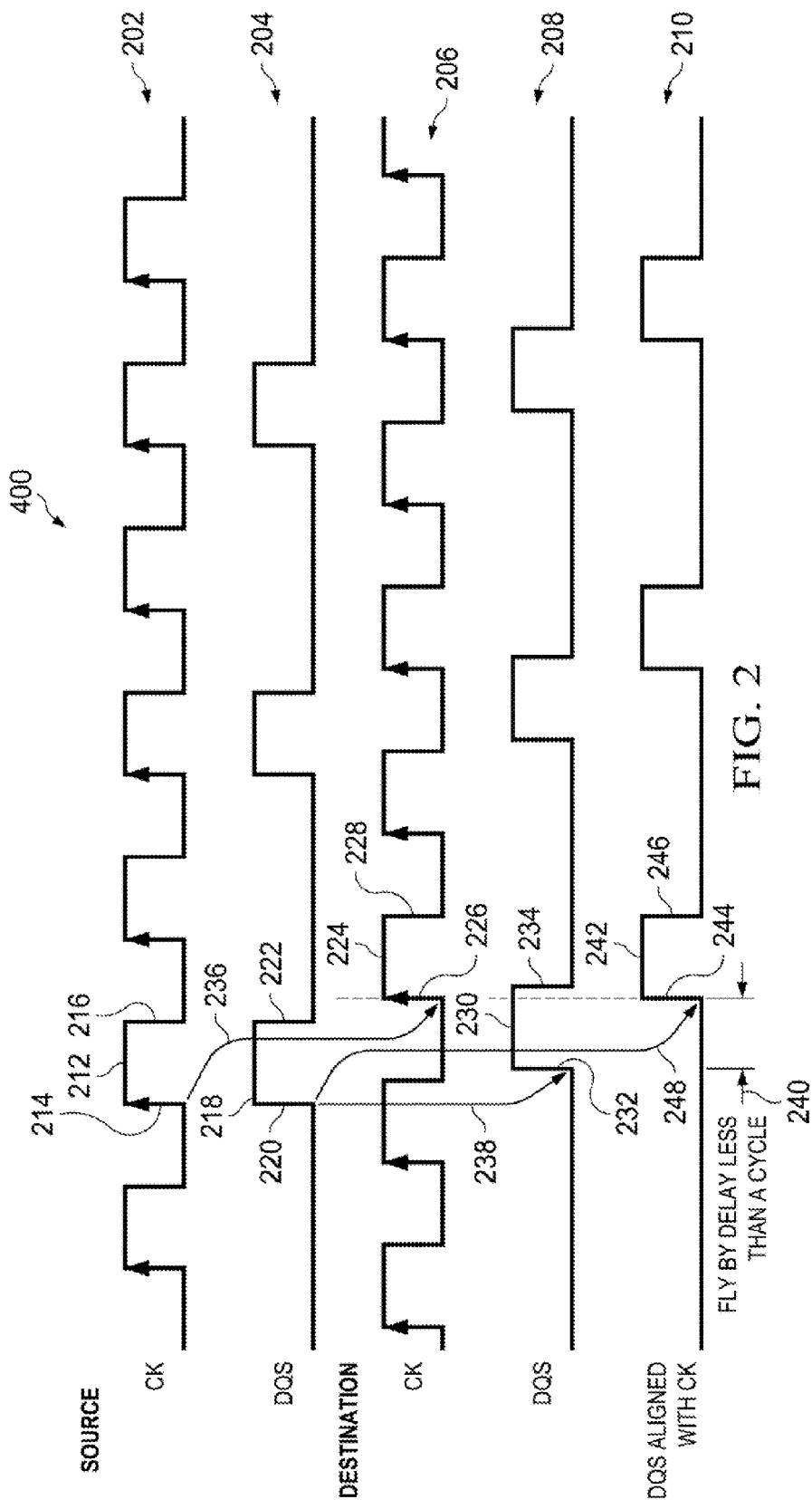
FIG. 2 illustrates example clock signals and DQS signals provided to one of the DRAMs of FIG. 1.

SDRAM circuit 300 has CK line 124, which includes extended path lengths indicated as sections 174, 176, 178, 180, 182, 184 and 186 and termination 188, of SDRAM circuit 100 of FIG. 1. SDRAM circuit 300 has DQS lines 142, 144, 146, 148, 150, 152, 154 and 156 of SDRAM circuit 100 of FIG. 1. SDRAM circuit 300 has DQ lines 126, 128, 130, 132, 134, 136, 138 and 140 of SDRAM circuit 100 of FIG. 1. SDRAM circuit 300 is additionally arranged to receive instructions from a processor (not shown) via line 122.

In contrast with SDRAM circuit 100 of FIG. 1, controller 304 of SDRAM circuit 300 provides DM signals to each of DRAMs 106, 108, 110, 112, 114, 116, 118 and 120 via DM lines (indicated by dashed-dotted arrows) 306, 308, 310, 312, 314, 316, 318 and 320, respectively.

The function of the DM line will be discussed in more detail below. In general, data provided on DM lines 306, 308, 310, 312, 314, 316, 318 and 320 work as a data mask. Data is to be written to a DRAM when a DQS rising or falling edge is detected at the DRAM. When the data on a DM line is 1'b1, data is masked and nothing is written into the DRAM. When the data on a DM line is 1'b1, data on the DQ line is written to the DRAM. Here, 1'b0 indicates a low signal and 1'b1 represents a high signal, wherein there is a 1 bit variable expressed in binary as a 1.

Write-leveling in accordance with an aspect of the present invention to compensate for flight-time skew greater than one clock cycle will now be further discussed with reference to FIG. 4.

Figure 4:
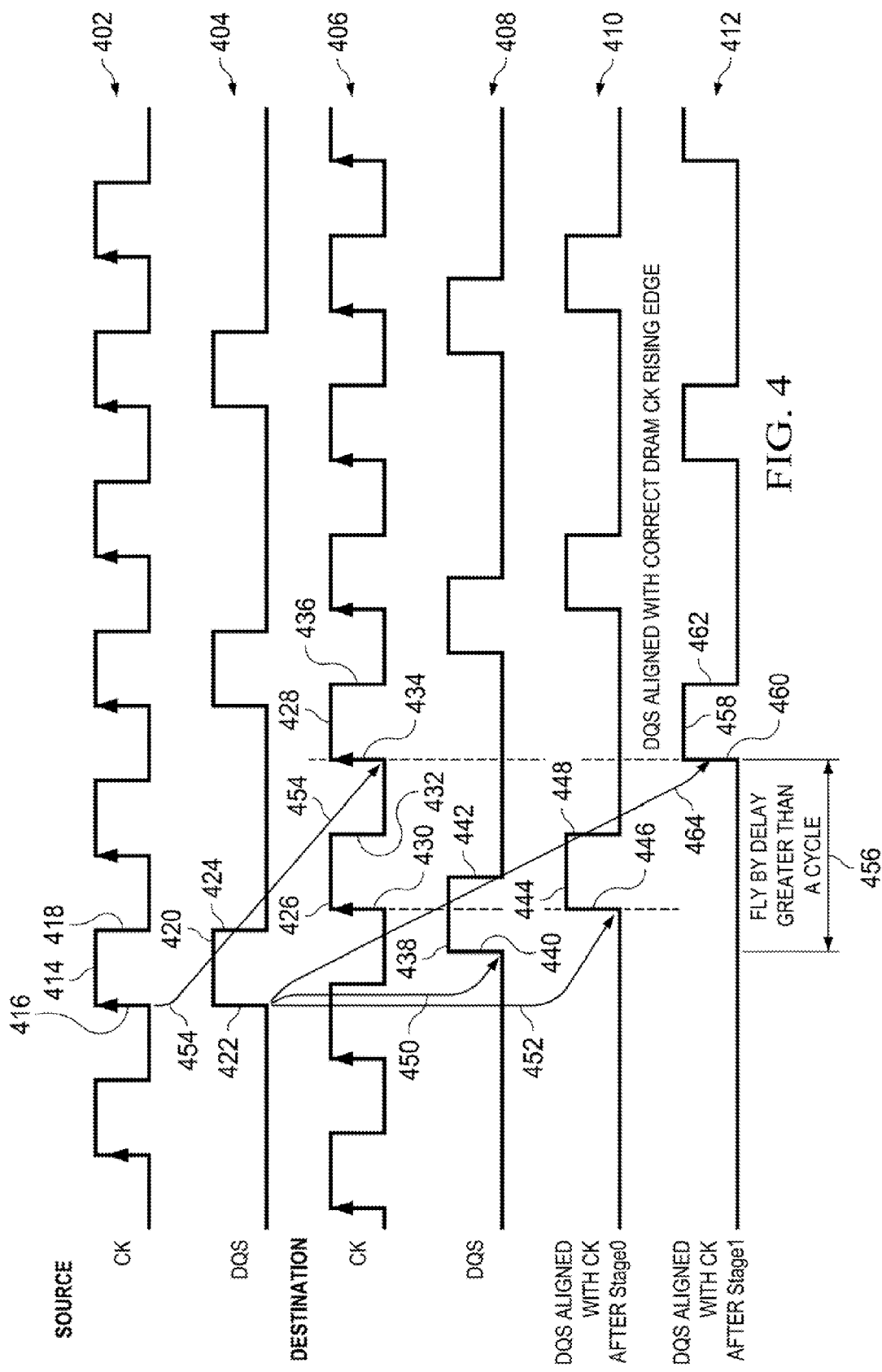
FIG. 4 illustrates example clock signals and DQS signals provided to an DRAM of FIG. 3, when write-leveling for flight-time skew greater than one clock cycle.

FIG. 4 illustrates example clock signals and DQS signals provided to DRAM 112 of FIG. 3, when write-leveling for flight-time skew greater than one clock cycle. As mentioned earlier, write-leveling will be performed for each DRAM. The example write-leveling discussed herein is provided only for DRAM 112 for purposes of brevity.

FIG. 4 includes a source CK signal 402, a source DQS signal 404, a destination CK signal 406, a destination DQS signal 408, an aligned DQS signal 410 and an aligned DQS signal 412.

Source CK signal 402 corresponds to the CK signal leaving controller 304 via CK line 124 after having traveled through extended paths indicated by sections 174, 176 and 178. Source DQS signal 404 corresponds to the DQS signal leaving controller 304 via DQS line 148. Destination CK signal 406 corresponds to the CK signal arriving at DRAM 112 via CK line 124 after having traveled through extended paths indicated by sections 174, 176 and 178. Destination DQS signal 408 corresponds to the DQS signal arriving at DRAM 112 via DQS line 148. Aligned DQS signal 410 corresponds to a subsequently transmitted DQS signal, as modified with a first stage of alignment, arriving at DRAM 112 via DQS line 148. Aligned DQS signal 412 corresponds to another subsequently transmitted DQS signal, as modified with a second stage of alignment, arriving at DRAM 112 via DQS line 148.

Source CK signal 402 includes a plurality of pulses, a representative of which is indicated as pulse 414. Pulse 414 includes a rising edge 416 and a falling edge 418.

Source DQS signal 404 includes a plurality of pulses, a representative of which is indicated as pulse 420. Pulse 420 includes a rising edge 422 and a falling edge 424.

Destination CK signal 406 includes a plurality of pulses, representative of which include pulse 426 and pulse 428. Pulse 426 includes a rising edge 430 and a falling edge 432. Pulse 428 includes a rising edge 434 and a falling edge 436.

Destination DQS signal 408 includes a plurality of pulses, a representative of which is indicated as pulse 438. Pulse 438 includes a rising edge 440 and a falling edge 442.

Aligned DQS signal 410 includes a plurality of pulses, a representative of which is indicated as pulse 444. Pulse 444 includes a rising edge 446 and a falling edge 448.

Aligned DQS signal 412 includes a plurality of pulses, a representative of which is indicated as pulse 458. Pulse 458 includes a rising edge 460 and a falling edge 462.

In this example, the delay of the CK signal from controller 104 to DRAM 112, is illustrated by arrow 454, whereas the delay of the DQS signal from controller 304 to DRAM 112 is illustrated by arrow 450. As shown by double arrow 456, this flight-time skew is greater than one clock cycle. In other words, the DQS signal arrives at DRAM 112 ahead of the CK signal by more than one clock cycle.

Now that the flight-time skew is known, controller 304 may adjust subsequent DQS signals such that a pulse is aligned with a pulse from the CK signals. This is shown in aligned DQS signal 410. Here, rising edge 440 of pulse 438 corresponds to rising edge 446 of pulse 444 of a subsequent DQS signal. However, in this case, because the flight-time skew is greater than one cycle, rising edge 446 of pulse 444 matches rising edge 430 of pulse 426 of destination CK signal 406. Pulse 426 is the wrong pulse. The DQS pulse should match with pulse 428.

Now that the DQS pulses are aligned with the CK pulses, in accordance with aspects of the present invention, controller 304 may adjust subsequent DQS signals such that they are aligned with the CK signals, i.e., the DQS delay is the same as the CK delay. This is shown in aligned DQS signal 412. Here, rising edge 446 of pulse 444 corresponds to rising edge 460 of pulse 458 of a subsequent DQS signal. Further, rising edge 460 of pulse 458 of the subsequent DQS signal is aligned with rising edge 434 of pulse 428. Therefore, the subsequent DQS signal is aligned with the clock signal.

Aligned DQS signal 410 corresponds to the first stage, wherein the absolute skew between rising edge 440 of DQS signal 408 and rising edge 430 of CK signal 406 is determined. Aligned DQS signal 412 corresponds to the second stage, wherein a DQS pulse is aligned with the correct CK pulse. In this example, the rising edge 460 of DQS signal 410 is aligned with rising edge 434 of CK signal 406.

In this example, the flight-time skew is more than one clock cycle. Aspects of the present invention may write-level for situations where the flight-time skew is up to three clock cycles. Further, aspects of the present invention may write-level for situations where the flight-time skew is negative.

Write-leveling in accordance with an aspect of the present invention to compensate for negative flight-time skew will now be further discussed with reference to FIG. 5.

Figure 5:
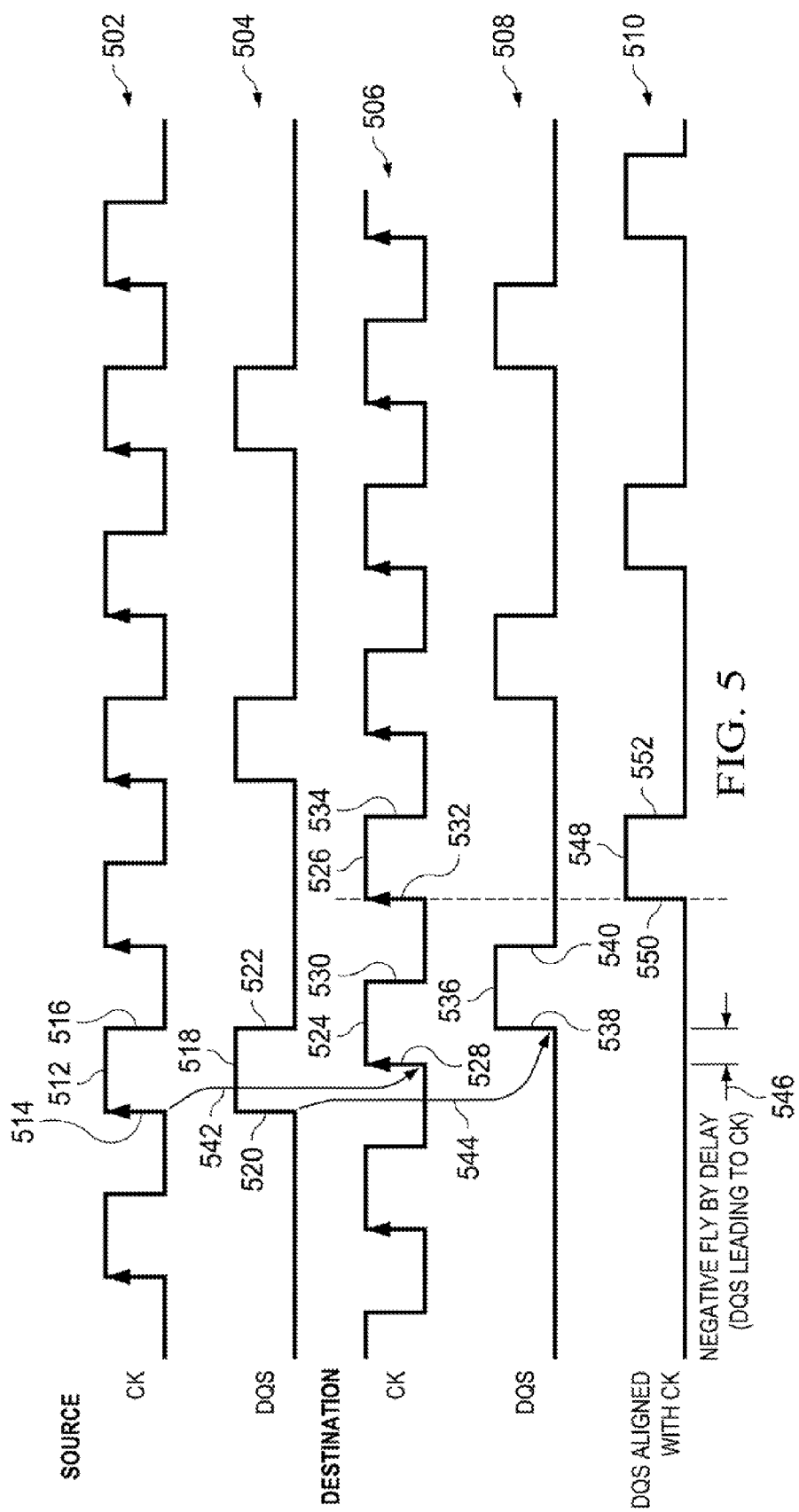
FIG. 5 illustrates example clock signals and DQS signals provided to an DRAM of FIG. 3, when write-leveling for negative flight-time skew.

FIG. 5 illustrates example clock signals and DQS signals provided to DRAM 112 of FIG. 3, when write-leveling for negative flight-time skew. As mentioned earlier, write-leveling will be performed for each DRAM. The example write-leveling discussed herein is provided only for DRAM 112 for purposes of brevity.

FIG. 5 includes a source CK signal 502, a source DQS signal 504, a destination CK signal 506, a destination DQS signal 508 and an aligned DQS signal 510.

Source CK signal 502 corresponds to the CK signal leaving DRAM 112 via CK line 124 after having traveled through extended paths indicated by sections 174, 176 and 178. Source DQS signal 504 corresponds to the DQS signal leaving controller 304 via DQS line 148. Destination CK signal 506 corresponds to the CK signal arriving at DRAM 112 via CK line CK line 124 after having traveled through extended paths indicated by sections 174, 176 and 178. Destination DQS signal 508 corresponds to the DQS signal arriving at DRAM 112 via DQS line 148. Aligned DQS signal 510 corresponds to a subsequently transmitted DQS signal arriving at DRAM 112 via DQS line 148.

Source CK signal 502 includes a plurality of pulses, a representative of which is indicated as pulse 512. Pulse 512 includes a rising edge 514 and a falling edge 516.

Source DQS signal 504 includes a plurality of pulses, a representative of which is indicated as pulse 518. Pulse 518 includes a rising edge 520 and a falling edge 522.

Destination CK signal 506 includes a plurality of pulses, representative of which include pulse 524 and pulse 526. Pulse 524 includes a rising edge 528 and a falling edge 530. Pulse 526 includes a rising edge 532 and a falling edge 534.

Destination DQS signal 508 includes a plurality of pulses, a representative of which is indicated as pulse 536. Pulse 536 includes a rising edge 538 and a falling edge 540.

Aligned DQS signal 510 includes a plurality of pulses, a representative of which is indicated as pulse 548. Pulse 548 includes a rising edge 550 and a falling edge 552.

In this example, the delay of the CK signal from DRAM 110 to DRAM 112, is illustrated by arrow 542, whereas the delay of the DQS signal from controller 304 to DRAM 112 is illustrated by arrow 544. As shown by double arrow 546, this flight-time skew negative. In other words, the CK signal arrives at DRAM 112 ahead of the DQS signal.

Now that the flight-time skew is known, in accordance with aspects of the present invention, controller 304 may adjust subsequent DQS signals such that they are aligned with the CK signals, i.e., the DQS delay is the same as the CK delay. This is shown in aligned DQS signal 510. Here, rising edge 550 of pulse 548 matches rising edge 532 of pulse 526. Therefore, the subsequent DQS signal is aligned with the clock signal.

In this example, Aligned DQS signal 410 corresponds to the first stage, wherein the absolute skew between rising edge 440 of DQS signal 408 and rising edge 430 of CK signal 406 is determined. Aligned DQS signal 412 corresponds to the second stage, wherein a DQS pulse is aligned with the correct CK pulse. In this example, the rising edge 460 of DQS signal 410 is aligned with rising edge 434 of CK signal 406.

An example structure that enables write-leveling to compensate for negative flight-time skew and flight-time skew that is greater than a clock cycle will now be described with reference to FIGS. 6-14.

Figure 6:
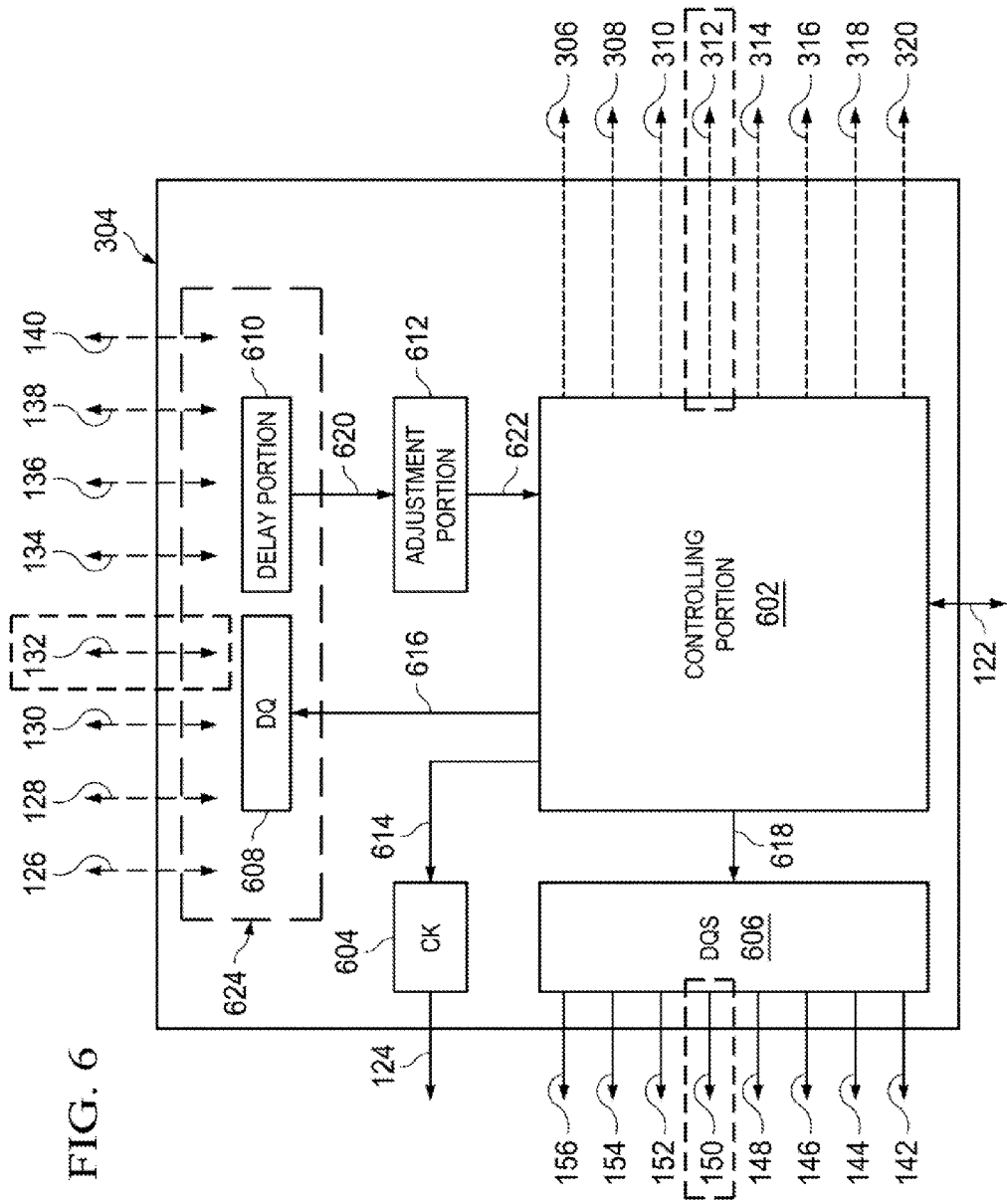
FIG. 6 illustrates a detailed view of an example controller of FIG. 3.

FIG. 6 illustrates a detailed view of an example of controller 304 of FIG. 3.

As shown in FIG. 6, controller 304 includes a controlling portion 602, a clock signal generating portion 604, a DQS signal generating portion 606, a DQ data generating portion 608, a delay determining portion 610 and an adjustment portion 612. In this example, controlling portion 602, clock signal generating portion 604, DQS signal generating portion 606, DQ data generating portion 608, delay determining portion 610 and adjustment portion 612 are distinct elements. However, in some embodiments, at least two of controlling portion 602, clock signal generating portion 604. DQS signal generating portion 606, DQ data generating portion 608, delay determining portion 610 and adjustment portion 612 may be combined as a unitary element. In other embodiments, at least one of controlling portion 602, clock signal generating portion 604, DQS signal generating portion 606, DQ data generating portion 608, delay determining portion 610 and adjustment portion 612 may be implemented as a computer having stored therein non-transient, tangible computer-readable media for carrying or having computer-executable instructions or data structures stored thereon. Such non-transient, tangible computer-readable media can be any available media that can be accessed by a general purpose or special purpose computer. Non-limiting examples of non-transient, tangible computer-readable media include physical storage and/or memory media such as RAM, ROM, EEPROM, CD-ROM or other optical disk storage, magnetic disk storage or other magnetic storage devices, or any other medium which can be used to carry or store desired program code means in the form of computer-executable instructions or data structures and which can be accessed by a general purpose or special purpose computer. When information is transferred or provided over a network or another communications connection (either hardwired, wireless, or a combination of hardwired or wireless) to a computer, the computer properly views the connection as a computer-readable medium. Thus, any such connection is properly termed a non-transient, tangible computer-readable media. Combinations of the above should also be included within the scope of non-transient, tangible computer-readable media.

Controlling portion 602 is arranged to receive instructions from a processor (not shown) via signal line 122. Accordingly, the processor may store and retrieve data within SDRAM circuit 300. However, before storage and retrieval may be performed. DIMM 302 must be calibrated, which is the basis of the discussion herein. As such, there will be no further discussion with respect to storage and retrieval of data by the processor via signal line 122.

Controlling portion 602 is operable to instruct DQS signal generating portion 606 via signal 618, to instruct clock signal generating portion 604 via signal 614 and to instruct DQ data generating portion 608 via signal 616. Controlling portion 602 is additionally operable to provide DM signals to each of DRAMs 106, 108, 110, 112, 114, 116, 118 and 120 via DM lines 306, 308, 310, 312, 314, 316, 318 and 320, respectively.

Clock signal generating portion 604 is operable to provide a clock (CK) signal to DRAM 106 via CK line 124, wherein the CK signal is based on a signal 614 from controlling portion 602.

DQ data generating portion 608 is operable to provide DQ data to each of DRAMs 106, 108, 110, 112, 114, 116, 118 and 120 via DQ lines 126, 128, 130, 132, 134, 136, 138 and 140, respectively, wherein the DQ data is based on a signal 616 from controlling portion 602.

DQS signal generating portion 606 is operable to provide DQS signals to each of DRAMs 106, 108, 110, 112, 114, 116, 118 and 120 via DQS lines 142, 144, 146, 148, 150, 152, 154 and 156, respectively, wherein each DQS signal is based on a signal 618 from controlling portion 602.

Delay determining portion 610 is operable to read data from each of DRAMs 106. 108, 110, 112, 114, 116, 118 and 120 via DQ lines 126, 128, 130, 132, 134, 136, 138 and 140, respectively. Delay determining portion 610 is additionally operable to generate a delay value based on the read data. Delay determining portion 610 is additionally operable to provide the delay value to adjustment portion 612 via a signal 620.

DQ data generating portion 608 and delay determining portion 610 share DQ lines 126, 128, 130, 132, 134, 136, 138 and 140. To simplify the discussion, a connection network is shown as dotted box 624. In this example, DW data generating portion 608 is able to write to the DRAMs via DQ lines 126, 128, 130, 132, 134, 136, 138 and 140, whereas delay determining portion 610 is able to read data from the DRAMs via DQ lines 126, 128, 130, 132, 134, 136, 138 and 140.

Adjustment portion 612 is operable to provide an adjustment value, based on the delay value, to controlling portion 602.

Returning to FIG. 3, controller 304 may control each DRAM independently in order to calibrate DIMM 302. In order to simplify the discussion, examples of write-leveling to adjust for flight-time skew associated with DRAMs 114, 116, 118 and 120 will be described. It should be noted however that a similar method of write-leveling would be performed for each DRAM.

For now, write-leveling to adjust for flight-time skew associated with DRAM 112 will be discussed. Accordingly, returning to FIG. 6, DQ line 132, DQS line 148, DQ line 132 and DM line 312 (each indicated with a dashed rectangle) will be used to describe write-leveling for DRAM 112.

As mentioned previously, an aspect of the present invention is drawn to a two-stage write-leveling system and method. In the first stage, the absolute skew between a DQS rising edge and the CK rising edge is determined. This will be described in greater detail with reference to FIG. 7.

Figure 7:
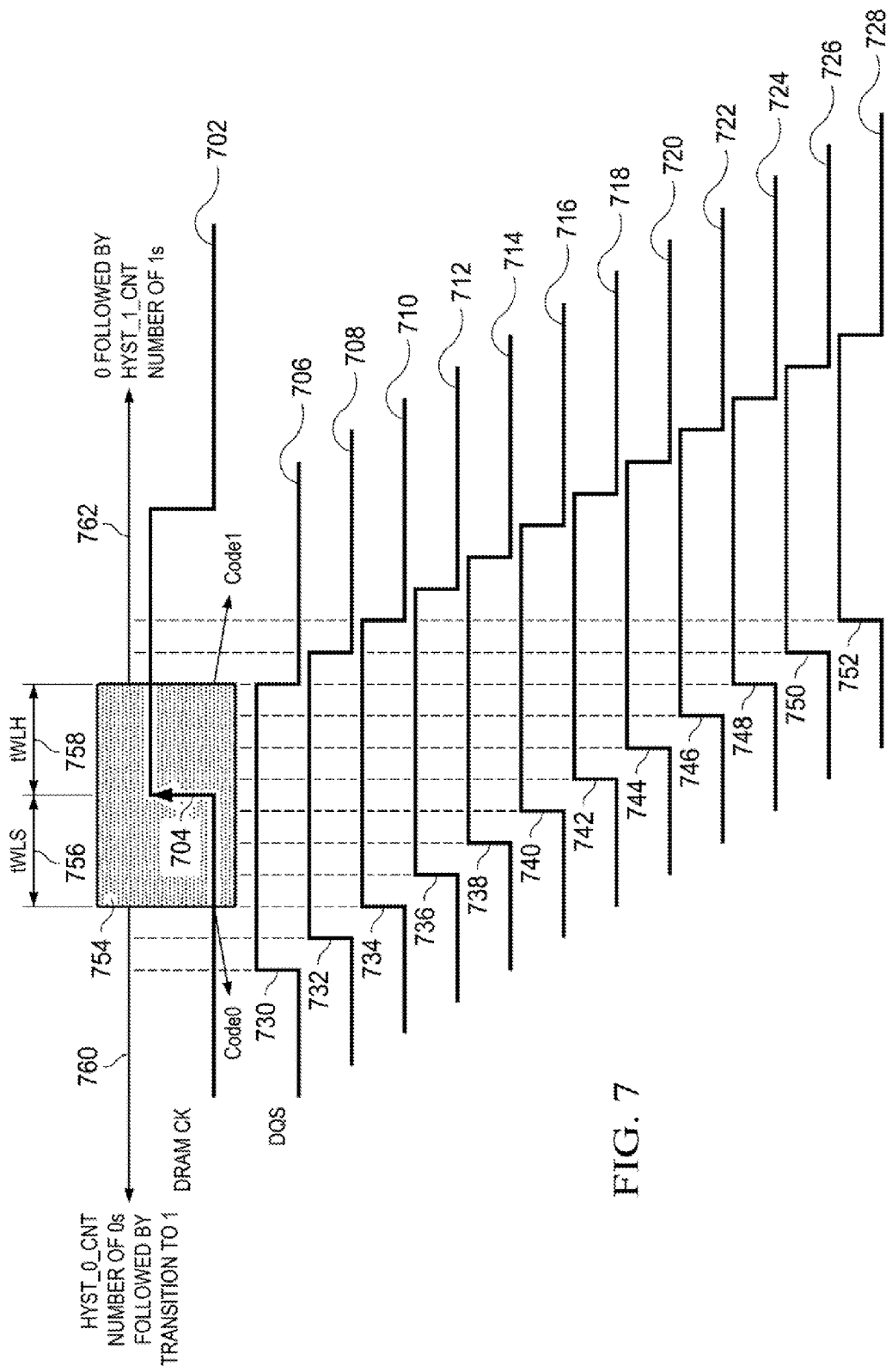
FIG. 7 illustrates a first stage of a two-stage write-leveling method for correcting flight-time skew in an DRAM, in accordance with aspects of the present invention.

FIG. 7 illustrates a first stage of a two-stage write-leveling method for correcting flight-time skew in DRAM 112, in accordance with aspects of the present invention.

FIG. 7 includes CK signal 702 as provided by CK line 124 (after having traveled through extended paths indicated by sections 174, 176 and 178), and a plurality of DQS signals 706, 708, 710, 712, 714, 716, 718, 720, 722, 724, 726 and 728, each as provided by DQS line 148. CK signal 702 includes a rising edge 704. DQS signals 706, 708, 710, 712, 714, 716, 718, 720, 722, 724, 726 and 728, each has a corresponding rising edge 730, 732, 734, 736, 738, 740, 742, 744, 746, 748, 750 and 752, respectively.

Each DRAM has an uncertainty window associated with setup and hold. Shaded area 754 represents the uncertainty window associated with DRAM 112. Shaded area 754 includes a setup window 756 and a hold window 758.

Setup window 756, as per JEDEC (Joint Electron Devices Engineering Council) Specification, is the write-leveling setup time window from the rising CK pulse crossing the rising DQS pulse and the write-leveling hold time window from the rising DQS pulse crossing the rising CK pulse.

Rising edge 704 is disposed in the middle of setup window 756 and hold window 758. Accordingly, the location of rising edge 704 may be found by determining the location in the middle of the beginning of setup window 756 and the end of hold window 758 is the location of rising edge 704. In accordance with an aspect of the present invention, a plurality of stepped DQS signals are used to locate rising edge 704 by determining the location in the middle of the beginning of setup window 756 and the end of hold window 758 is the location of rising edge 704.

Returning to FIG. 6, first controlling portion 602 instructs, via signal 614, clock signal generating portion 604 to provide a CK signal. The CK signal will eventually arrive at DRAM 112 via CK line 124 after having traveled through extended paths indicated by sections 174, 176 and 178. The CK signal is received by DRAM 112 as CK signal 702 as shown in FIG. 7.

Returning again to FIG. 6, controlling portion 602 additionally instructs, via signal 618, DQS signal generating portion 606 to provide a DQS signal on DQS line 148 to DRAM 112. In this example, the DQS signal received by DRAM 112 on DQS line 148 is DQS signal 706 as shown in FIG. 7.

In this case, CK signal 702 is not high at rising edge 730 of DQS signal 706. Delay determining portion 610 checks feedback from DRAM 112 via DQ line 132. In this case, delay determining portion 610 reads will read a binary zero. The binary zero is passed to controlling portion 602 via signal 620, adjustment portion 612 and signal 622.

In this first stage, leveling data is not being written into the memory. The goal is to remove absolute skew between the CK signal and DQS signal. Thus when DRAM 112 is sampled at a time corresponding to rising edge 730, CK 702 will be low, such that the sampled data will be 0. The aim is to align the rising edge of the DQS signal with the rising edge of the CK signal, i.e., the 0→1 transition of CK signal 702, which is rising edge 704.

Once there is alignment of the rising edge of the CK signal and the rising edge of the DQS signal, it will be determined whether the rising edge of the DQS signal is aligned with the rising edge of the correct CK signal. As will be discussed later, this will be performed by writing data into the DRAM over two writing sequences.

DRAM 112 will be providing feedback of the DQS signal with respect to the CK signal. If rising edge 730 was aligned with some point within setup window 756 and hold window 758, then feedback or delay signal will be metastable 0 or 1.

At this point, controlling portion 602 will get a stable 0 in the feedback. Therefore, controlling portion 602 is able to determine that rising edge 730 was prior to setup window 756. However, controlling portion 602 is unable to determine the amount that rising edge is prior to setup window 756. For this reason, controlling portion 602 is unable to find the beginning of setup window 756. To find the beginning of setup window 756, controlling portion 602 will step the DQS signal.

More particularly, returning to FIG. 6, controlling portion 602 again instructs, via signal 614, clock signal generating portion 604 to provide CK signal 702 as shown in FIG. 7, to DRAM 112. Controlling portion 602 additionally instructs, via signal 618, DQS signal generating portion 606 to provide a DQS signal on DQS line 148 to DRAM 112. Now, in this example, the DQS signal received by DRAM 112 on DQS line 148 is DQS signal 708 as shown in FIG. 7.

In this case, CK signal 702 is not high at rising edge 732 of DQS signal 708. Similar to the discussion above, with reference to DQS signal 706, in this case controlling portion 602 is able to determine that rising edge 732 was prior to setup window 756. The process is then repeated.

Returning to FIG. 6, controlling portion 602 again instructs, via signal 614, clock signal generating portion 604 to provide CK signal 702 as shown in FIG. 7, to DRAM 112. Controlling portion 602 additionally instructs, via signal 618, DQS signal generating portion 606 to provide a DQS signal on DQS line 148 to DRAM 112. Now, in this example, the DQS signal received by DRAM 112 on DQS line 148 is DQS signal 710 as shown in FIG. 7.

In this case, rising edge 734 is aligned with setup window 756, which would then have been detected through feedback from DRAM 112 by delay determining portion 610. When a series of zeros followed by a "1" is detected in the feedback, it is considered as the start of setup window 756. The number of zeros to be checked before a "1," may be preprogrammed. In this case controlling portion 602 is able to determine that rising edge 734 is aligned somewhere within setup window 756 and hold window 758. However, controlling portion 602 is unable to determine at what point within setup window 756 and hold window 758 that rising edge 734 is aligned. To find the size of setup window 756 and hold window 758, the process is again repeated.

Returning to FIG. 6, DQS signal 726, a DQ signal and CK signal 702 are continued to be sent to DRAM 112. The resulting values are read therefrom. As shown in FIG. 7, controlling portion 602 is able to determine that rising edges 736, 738, 740, 742, 744, 746 and 748, corresponding to DQS signals 712, 714, 716, 718, 720, 722 and 724, respectively are aligned somewhere within setup window 756 and hold window 758.

Returning to FIG. 6, DQS signal 728, a DQ signal and CK signal 702 are again sent to DRAM 112. The resulting value is read therefrom. In this case, as shown in FIG. 7, CK signal 702 is high at rising edge 752 of DQS signal 728. A consecutive high value indicates an end to hold window 758.

Control portion is then able to determine that setup window 756 must start at some time after the rising edge 732 and that hold window 758 must end some time before rising edge 750. Therefore, rising edge 704 of CK signal 702 is likely in the proximity of the middle of rising edge 732 and rising edge 750. As shown in FIG. 7, rising edge 704 of CK signal 702 in the middle of rising edge 732 and rising edge 750.

In any event, a DQS signal may be "properly aligned" with a CK signal so long as the rising edge of the DQS signal is within the setup window or hold window. This is shown in FIG. 8.

Figure 8:
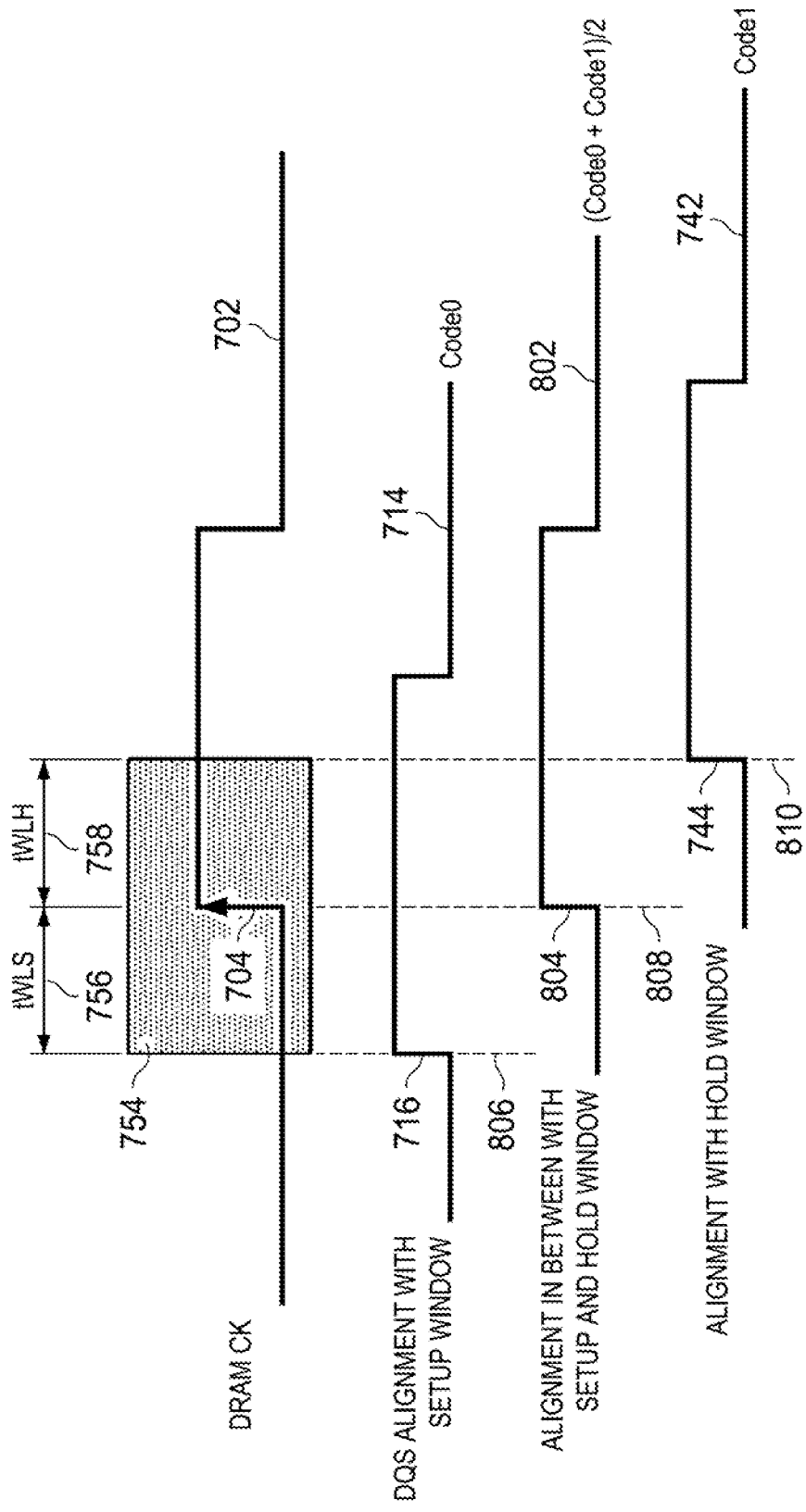
FIG. 8 illustrates alignment scenarios of the DQS signal with the CK signal.

FIG. 8 illustrates alignment scenarios of the DQS signal with the CK signal.

As shown in the figure, FIG. 8 includes CK signal 702, DQS signal 714, a DQS signal 802 and DQS signal 742. DQS signal 802 is provided by DQS line 148 and includes a rising edge 804.

In one situation, rising edge 716 of DQS signal 714 is aligned with the beginning of setup window 756, as indicated by dotted line 806. In another situation, rising edge 804 of DQS signal 802 is aligned with rising edge 704 of CK signal 702, as indicated by dotted line 808. In another situation, rising edge 744 of DQS signal 742 is aligned with the end of hold window 758, as indicated by dotted line 810. Returning to FIG. 7, clearly any one of DQS signals 710, 712, 714, 716, 718, 720, 722 and 724 would be considered properly aligned with CK signal 702.

Now that controlling portion 602 has determined how to align a rising edge of a DQS pulse with the correct rising edge of a CK pulse, it must determine which CK pulse to use. This is the second stage of write-leveling in accordance with aspects of the present invention. This second stage actually includes two data writing sequences, which will be described in greater detail with reference to FIGS. 9-18.

Figure 9:
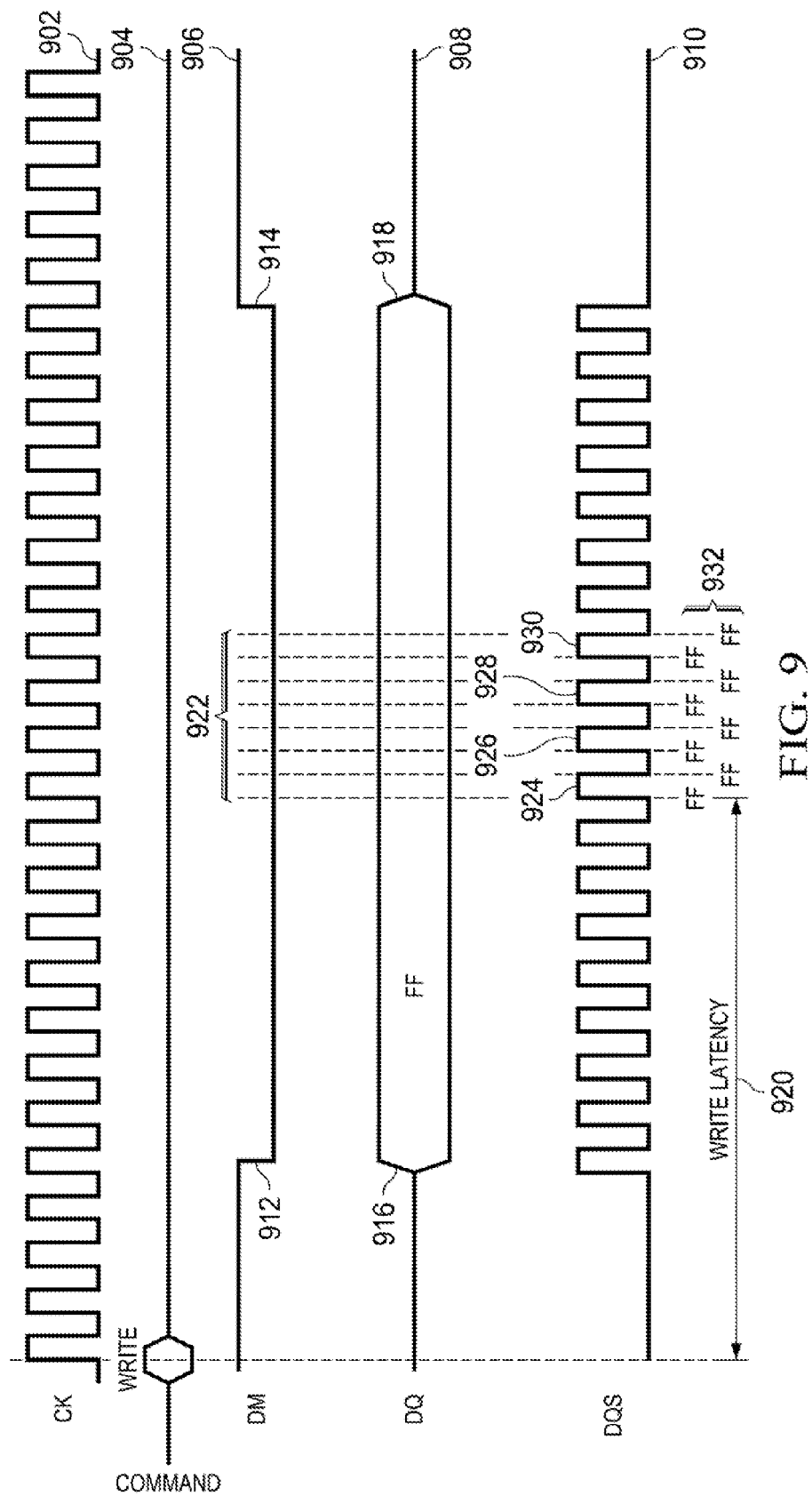
FIG. 9 illustrates a first writing sequence of a DRAM for the second stage of a two-stage write-leveling system and method in accordance with aspects of the present invention.

FIG. 9 illustrates a first writing sequence of DRAM 112 for the second stage of a two-stage write-leveling system and method in accordance with aspects of the present invention. Again, it should be noted that this first writing sequence would be performed for each DRAM in DIMM 302. However, for purposes of brevity, only the sequence for DRAM 112 will be discussed.

With additional reference to FIG. 3, FIG. 9 includes a CK signal 902 provided to DRAM 112 via CK line 124 (after having traveled through extended paths indicated by sections 174, 176 and 178), a command signal 904, a DM signal 906 provided to DRAM 112 via DM line 312, a DQ signal 908 provided to DRAM 112 via DQ line 132 and a DQS signal 910 provided to DRAM 112 via DQS line 148.

Command line 904 corresponds to a command for writing or retrieving data as instructed by a processor (not shown), as associated signal line 122. However, before storage and retrieval may be performed, DIMM 302 must be calibrated.

During the second stage of write-leveling, a command line is used to issue write and read commands to a respective DRAM. As will be described, in the second stage of write-leveling, data is written to a respective DRAM twice and is read back once. So during second stage write-leveling, two write commands and one read command will be issued. These commands can be issued from outside SDRAM circuit 300 or can be generated within controller 304. In the case where the commands are issued from outside SDRAM circuit 300, controller 304 may include an additional processor within to address such outside commands. In this example described with reference to FIGS. 9-10, only writes commands are shown and the read commands are not. For this reason, command line 904 is low.

DM signal 906 includes a falling area bounded by an edge 912 and an edge 914. DQ signal 908 includes an area bounded by an edge 916 and an edge 918. DQS signal 910 includes a plurality of pulses, which include pulse 924, pulse 926, pulse 928 and pulse 930.

Returning to FIG. 6, in this writing sequence, DQ signal 908 is provided by DQ data generating portion 608. In this example let DQ signal 908 be data "FF". DQ data generating portion 608 provides the data to DRAM 112 for a sufficient number of clock cycles, for example as shown in FIG. 9 as the distance between edge 916 and edge 918. Providing the data for this extended period ensures that data will be written to DRAM 112 even if by the first writing sequence discussed above with reference to FIG. 9, the DQS signal is not aligned with correct CK signal.

With reference to FIG. 6, DQS signal 910 is provided by DQS signal generating portion 606. Similar to the DQ data, DQS signal generating portion 606 provides DQS signal 910 to DRAM 112 for a sufficient number of clock cycles. In this example, DQS signal 910 is provided for the same period as DQ signal 908. Providing the data for this extended period ensures that data will be written to DRAM 112 even if by the first writing sequence discussed above with reference to FIG. 9, the DQS signal is not aligned with correct CK signal.

With reference to FIG. 6, DM signal 906 is provided by controlling portion 602. Again, controlling portion 602 provides DM signal 906 to DRAM 112 for a sufficient number of clock cycles. In this example, DM signal 906 is provided for the same period as the DQ signal 908. Providing the data for this extended period ensures that data will be written to DRAM 112 even if by the first writing sequence discussed above with reference to FIG. 9, the DQS signal is not aligned with correct CK signal.

With this arrangement, DQ data FF within DQ signal 908 is essentially "waiting at the door" of DRAM 112. DM signal 906 acts as a data mask for DRAM 112. DQS signal 910 actuates DRAM 112 to write data provided by DQ signal 908, so long as DRAM 112 is not masked by DM signal 906. In this manner, DRAM 112 writes DQ data FF, which occurs after a write latency period indicated by double arrow 920. Rising and falling edges of pulses 924, 926, 928 and 930 of DQS signal 910 correspond to the times when data FF is provided to DRAM 112 via DQ signal 908, an actuating rising edge of a DQS pulse is provided to DRAM 112 via DQS signal 910, a data mask is provided to DRAM 112 via DM signal 906, as shown in FIG. 9

The first stage of write-leveling, for example as discussed above with reference to FIG. 7, ensures that that a CK pulse is aligned with the DQS pulse. Now, in second stage, the DRAM just checks rising and falling edge of the DQS pulse and captures data accordingly. The DM bit is to mask the data. If the DM bit is set to zero during edges of the DQS pulse, then data available on the DQ line will be written to the DRAM. If the DM bit is set to one during edges of the DQS pulse, then data is masked and nothing is written in the DRAM, or the DRAM holds the previously written data. In this example, a data string of FF FF FF FF FF FF FF is written into DRAM 112. At this point, DRAM 112 has been initialized.

Now a second writing sequence is performed to determine whether the flight-time skew is negative (the CK signal trials the DQS signal by more than a clock cycle), whether the CK and DQS signal are aligned (no flight-time skew), or the amount of the positive flight-time skew (how many cycles the DQS signal trails the CK signal).

Figure 10:
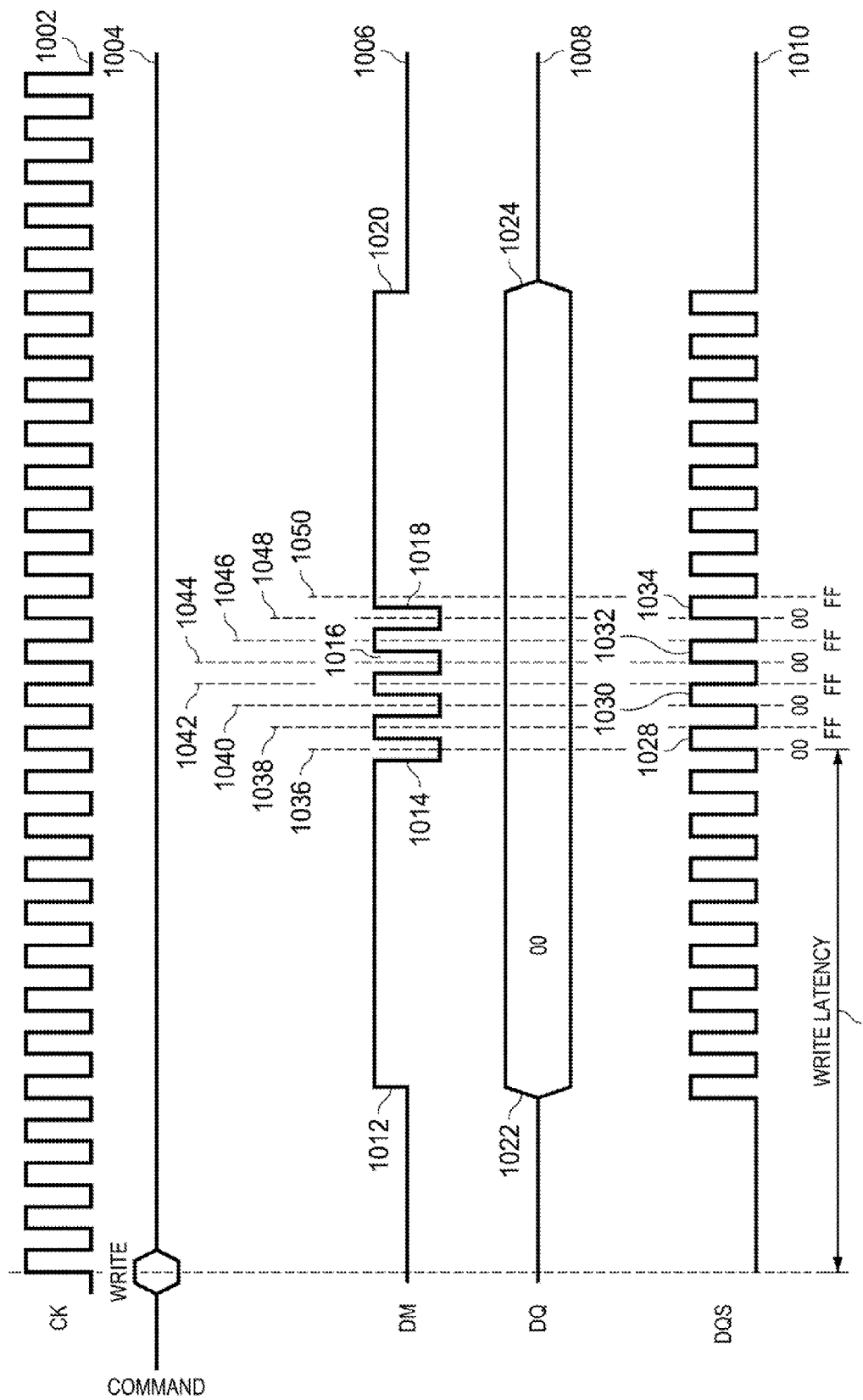
FIG. 10 illustrates a second writing sequence of a DRAM discussed with reference to FIG. 9, for the second stage of a two-stage write-leveling system and method in accordance with aspects of the present invention.

FIG. 10 illustrates a second writing sequence of DRAM 112 for the second stage of a two-stage write-leveling system and method in accordance with aspects of the present invention. After the first stage write-leveling, as discussed above with reference to FIG. 7, the first writing sequence does not compensate any skew. The first writing sequence is the way to ensure that data is written to the DRAM in preparation for the second writing sequence.

With additional reference to FIG. 3, FIG. 10 includes a CK signal 1002 provided to DRAM 112 via CK line 124 (after having traveled through extended paths indicated by sections 174, 176 and 178), a command signal 1004, a DM signal 1006 provided to DRAM 112 via DM line 312, a DQ signal 1008 provided to DRAM 112 via DQ line 132 and a DQS signal 1010 provided to DRAM 112 via DQS line 148.

Command signal 1004 corresponds to a command for writing or retrieving data as instructed by a processor (not shown), as associated signal line 122. Again, as discussed above with reference to command line 904 of FIG. 9, in the second stage of write-leveling, a command line is used to issue write and read commands to a respective DRAM. In the second state of write-leveling, data is written to a respective DRAM twice and is read back once. So during second stage write-leveling, two write commands and one read command will be issued. In this example, only the write commands are shown and the read commands are not. For this reason, command line 1004 is low.

DM signal 1006 includes a rising non-writing area bounded by an edge 1012 and an edge 1014, a writing area 1016 bounded by edge 1014 and an edge 1018 and another non-writing area bounded by edge 1018 and an edge 1020. DQ signal 1008 includes an area bounded by an edge 1022 and an edge 1024. DQS signal 1010 includes a plurality of pulses, which include pulse 1028, pulse 1030, pulse 1032 and pulse 1034.

Returning to FIG. 6, in this writing sequence, DQ signal 1008 is provided by DQ data generating portion 608. In this example let DQ signal 1008 be data "00". DQ data generating portion 608 provides the data to DRAM 112 for a sufficient number of clock cycles, for example as shown in FIG. 10 as the distance between edge 1022 and edge 1024. Providing the data for this extended period ensures that data will be written to DRAM 112 even if by the first write-leveling stage discussed above with reference to FIG. 7, the DQS signal is not aligned with correct CK signal.

With reference to FIG. 6, DQS signal 1010 is provided by DQS signal generating portion 606. Similar to the DQ data, DQS signal generating portion 606 provides DQS signal 1010 to DRAM 112 for a sufficient number of clock cycles. In this example. DQS signal 1010 is provided for the same period as DQ signal 1008. Providing the data for this extended period ensures that data will be written to DRAM 112 even if by the first write-leveling stage discussed above with reference to FIG. 7, the DQS signal is not aligned with correct CK signal.

In this second writing sequence, the DM bit is toggled. It is the toggling of the single bit that will eventually enable determination of the type of flight-time skew. In this example, with reference to FIG. 6, DM signal 1006 is provided by controlling portion 602. Controlling portion 602 provides non-masking DM signal 1006 to DRAM 112 that, when DM is low, start at the write latency determined in the first writing sequence discussed above with reference to FIG. 9. In this case, the write latency is indicated by double arrow 1026.

Starting at the rising edge of pulse 1028 of DQS signal 1010, which corresponds to the write latency for DRAM 112, DM signal 1006 is toggled for every edge of DQS signal 1010, as shown by dotted lines 1036, 1038, 1040, 1042, 1044, 1046, 1048 and 1050. Accordingly, DM signal 1006 enabled writing of "00" data from DQ data 1008 for times shown by dotted lines 1036, 1040, 1044 and 1048. Further, DM signal 1006 is masking data from DQ data 1008 for times shown by dotted lines 1038, 1042, 1046 and 1050.

With this arrangement, DQ data 00 within DQ signal 1008 is essentially "waiting at the door" of DRAM 112. Data is masked when DM signal 1006 is high. At time shown by dotted lines 1036, 1040, 1044 and 1048, DM signal 1006 is low, which means that data is not masked. As such, whatever data is available on DQ signal 1008 will be written to DRAM 112. DQS signal 1010 actuates DRAM 112 to write data provided by DQ signal 1008, so long as DRAM 112 is not masked by DM signal 1006. In this manner, DRAM 112 writes DQ data 00 for times shown by dotted lines 1036, 1040, 1044 and 1048, which occurs after a write latency period indicated by double arrow 1026. Rising edges of pulses 1028, 1030, 1032 and 1034 of DQS signal 1010 correspond to the times when data 00 is provided to DRAM 112 via DQ signal 1008, an actuating rising edge of a DQS pulse is provided to DRAM 112 via DQS signal 1010, a data mask is provided to DRAM 112 via DM signal 1006. Providing the data for this extended period ensures that data will be written to DRAM 112 even if by the first write-leveling stage discussed above with reference to FIG. 7, the DQS signal is not aligned with correct CK signal.

In this example, the previously stored data FF remains in DRAM 112 for the times shown by dotted lines 1038, 1042, 1046 and 1050. The final data stored in DRAM 112 is 00 FF 00 FF 00 FF 00 FF.

The stored data in DRAM 112 is then read by delay determining portion 610 via DQ line 132. Adjustment portion 612 determines that because the data read from DRAM 112 does not include any repeating values, then there is no adjustment needed to account for flight-time skew.

Now the situation of negative flight-time skew will be discussed.

For purposes of discussion, presume that DRAM 114 will have a negative flight-time skew. Aspects of the present invention to determine and address the negative flight-time skew will be described with additional reference to FIGS. 11 and 12.

Figure 11:
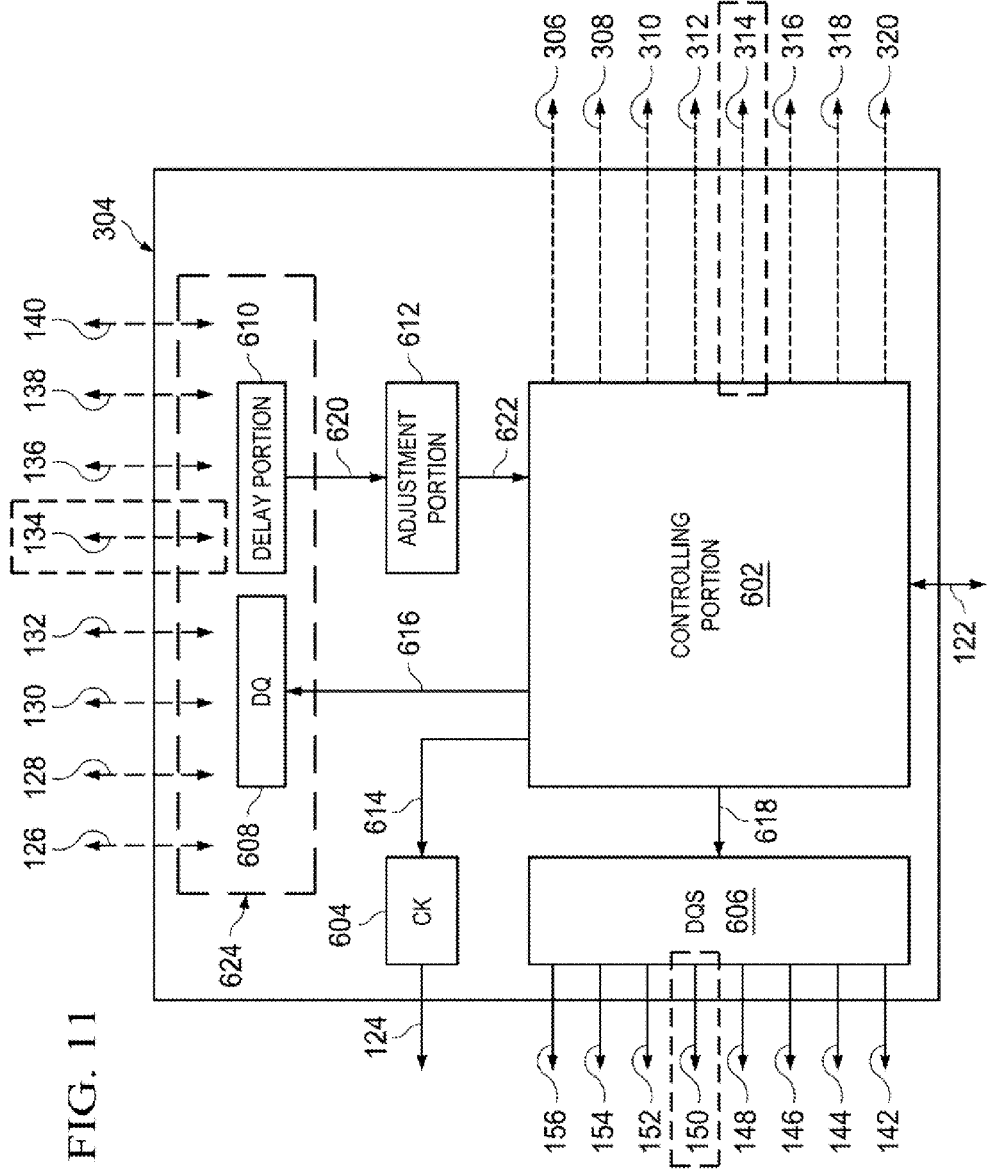
FIG. 11 illustrates another detailed view of an example of the controller of FIG. 3.

FIG. 11 illustrates a detailed view of an example of controller 304 of FIG. 3. FIG. 11 differs from FIG. 6 in that in FIG. 11, write-leveling to adjust for flight-time skew associated with DRAM 114 will be discussed. Accordingly, as shown in FIG. 11, DQ line 134, DQS line 150. DQ line 134 and DM line 314 (each indicated with a dashed rectangle) will be used to describe write-leveling for DRAM 114.

Figure 12:
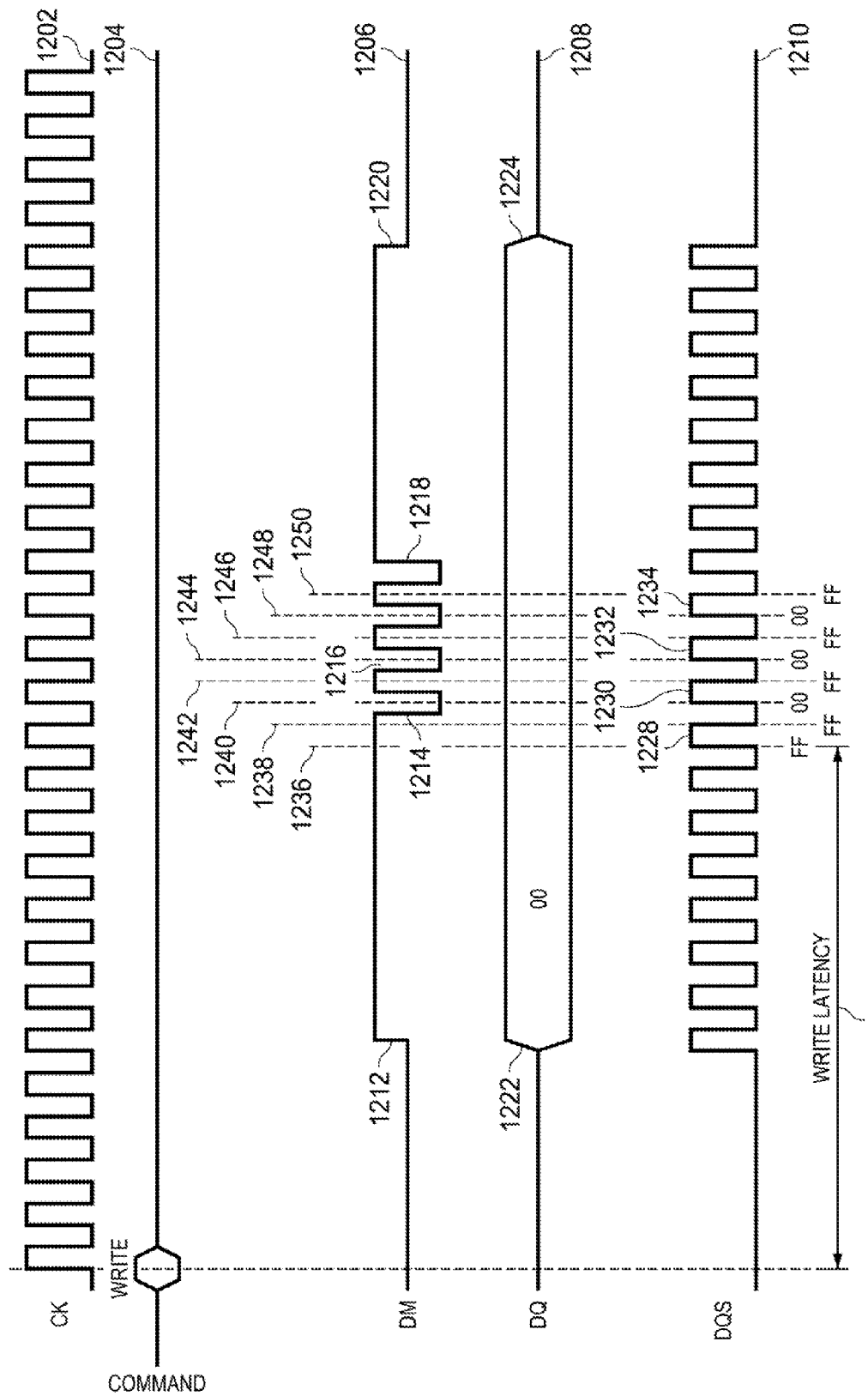
FIG. 12 illustrates a second writing sequence of the DRAM discussed with reference to FIG. 11, for the second stage of a two-stage write-leveling system and method in accordance with aspects of the present invention.

FIG. 12 illustrates a second writing sequence of DRAM 114 for the second stage of a two-stage write-leveling system and method in accordance with aspects of the present invention. For purposes of discussion, in this example, let the flight-time skew of DRAM 114 be negative, for example as discussed above with reference to FIG. 5.

With additional reference to FIG. 3, FIG. 12 includes a CK signal 1202 provided to DRAM 114 via CK line 124 (after having traveled through extended paths indicated by sections 174, 176, 178 and 180), a command signal 1204, a DM signal 1206 provided to DRAM 114 via DM line 314, a DQ signal 1208 provided to DRAM 114 via DQ line 134 and a DQS signal 1210 provided to DRAM 114 via DQS line 150.

Command signal 1204 corresponds to a command for writing or retrieving data as instructed by a processor (not shown), as associated signal line 122. Again, as discussed above with reference to command line 904 of FIG. 9, in the second stage of write-leveling, a command line is used to issue write and read commands to a respective DRAM. In the second state of write-leveling, data is written to a respective DRAM twice and is read back once. So during second stage write-leveling, two write commands and one read command will be issued. In this example, only the write commands are shown and the read commands are not. For this reason, command line 1204 is low.

DM signal 1206 includes a falling a non-writing area bounded by an edge 1212 and an edge 1214, a writing area 1216 bounded by edge 1214 and an edge 1218 and another non-writing area bounded by edge 1218 and an edge 1220. DQ signal 1208 includes an area bounded by an edge 1222 and an edge 1224. DQS signal 1210 includes a plurality of pulses, which include pulse 1228, pulse 1230, pulse 1232 and pulse 1234.

With reference to FIG. 11, DQS signal 1210 is provided by DQS signal generating portion 606. Similar to the DQ data, DQS signal generating portion 606 provides DQS signal 1210 to DRAM 114 for a sufficient number of clock cycles. In this example, DQS signal 1210 is provided for the same period as DQ signal 1208. Providing the data for this extended period ensures that data will be written to DRAM 114 even if by the first write-leveling stage discussed above with reference to FIG. 7, the DQS signal is not aligned with correct CK signal.

As discussed above, in this second writing sequence, the DM bit is toggled. In this example, with reference to FIG. 11, DM signal 1206 is provided by controlling portion 602. Controlling portion 602 provides non-masking DM signal 1206 to DRAM 114 that, when DM is low, start after the write latency determined in the first writing sequence discussed above with reference to FIG. 9. In this case, the write latency is indicated by double arrow 1226.

Starting at the rising edge of pulse 1230 of DQS signal 1210, which is after the write latency for DRAM 114, DM signal 1206 is toggled for every edge of DQS signal 1210. Accordingly. DM signal 1206 enabled writing of "00" data from DQ data 1208 for times shown by dotted lines 1240, 1244 and 1248. Further, DM signal 1206 is masking data from DQ data 1208 for times shown by dotted lines 1236, 1238, 1242, 1246 and 1250.

With this arrangement, DQ data 00 within DQ signal 1208 is essentially "waiting at the door" of DRAM 114. Data is masked when DM signal 1206 is high. At time shown by dotted lines 1240, 1244 and 1248, DM signal 1206 is low, which means that data is not masked. As such, whatever data is available on DQ signal 1208 will be written to DRAM 114. DQS signal 1210 actuates DRAM 114 to write data provided by DQ signal 1208, so long as DRAM 114 is not masked by DM signal 1206. In this manner, DRAM 114 writes DQ data 00 for times shown by dotted lines 1240, 1244 and 1248, which occurs after a write latency period indicated by double arrow 1226. Rising edges of pulses 1230, 1232 and 1234 of DQS signal 1010 correspond to the times when data 00 is provided to DRAM 114 via DQ signal 1208, an actuating rising edge of a DQS pulse is provided to DRAM 114 via DQS signal 1210, and a data mask is provided to DRAM 114 via DM signal 1206 and DRAM 114. Providing the data for this extended period ensures that data will be written to DRAM 114 even if by the first write-leveling stage discussed above with reference to FIG. 7, the DQS signal is not aligned with correct CK signal.

In this example, the previously stored data FF remains in DRAM 114 for the times shown by dotted lines 1236, 1238, 1242, 1246 and 1050. The final data stored in DRAM 114 is FF FF 00 FF 00 FF 00 FF.

The stored data in DRAM 114 is then read by delay determining portion 610 via DQ line 134. Adjustment portion 612 determines that because the data read from DRAM 114 includes repeating values FF and FF in the beginning of the data string, then there is adjustment needed to account for a negative flight-time skew.

Accordingly, for DRAM 114, a DQS signal provided by DQS signal generating portion 606 via DQS line 150 will be aligned with a CK signal provided by CK line 124 from clock signal generating portion 604 in a manner discussed above with reference to FIG. 5.

Now the situation of flight-time skew of one cycle will be discussed.

For purposes of discussion, presume that DRAM 116 will have a flight-time skew of one cycle. Aspects of the present invention to determine and address the flight-time skew of one cycle will be described with additional reference to FIGS. 13 and 14.

Figure 13:
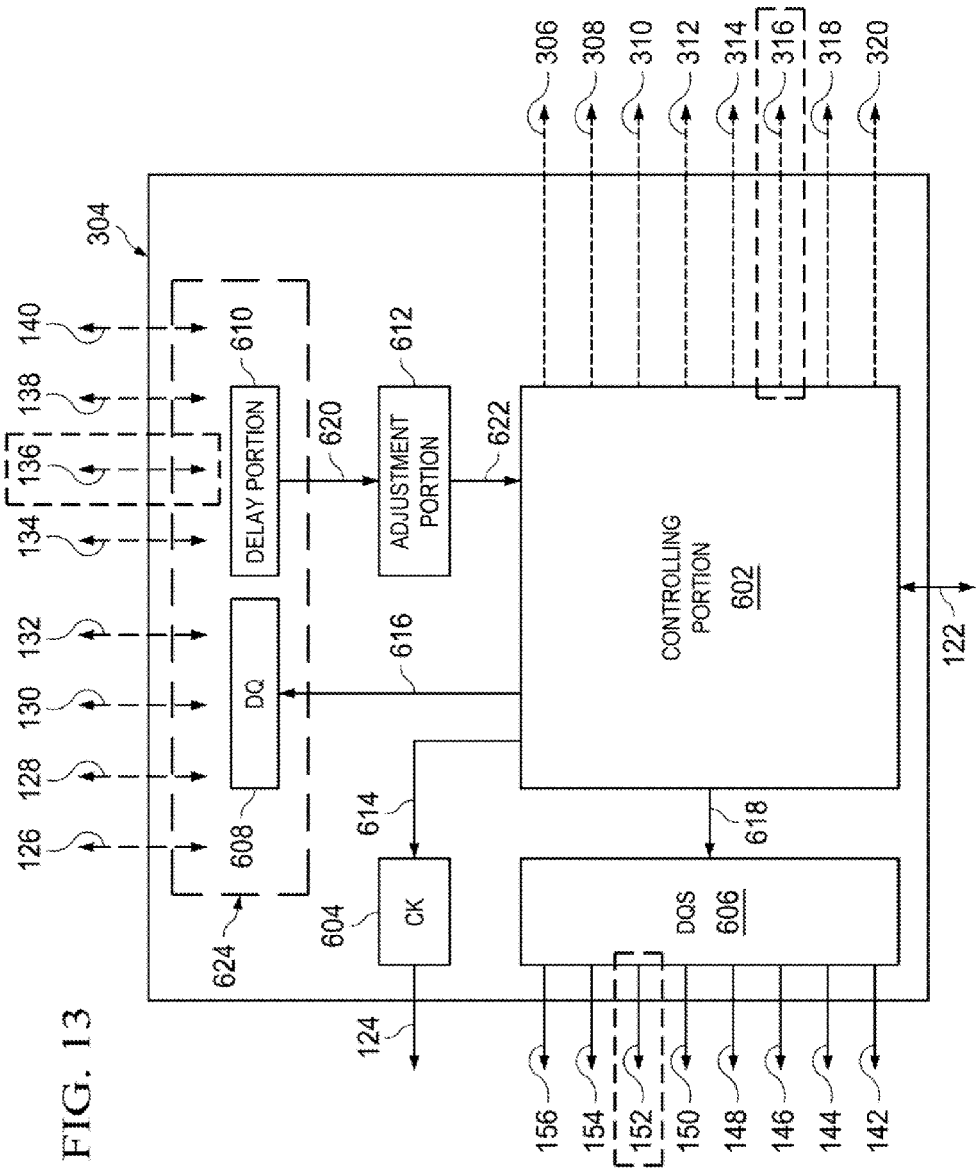
FIG. 13 illustrates another detailed view of an example of the controller of FIG. 3.

FIG. 13 illustrates a detailed view of an example of controller 304 of FIG. 3. FIG. 13 differs from FIG. 11 in that in FIG. 13, write-leveling to adjust for flight-time skew associated with DRAM 116 will be discussed. Accordingly, as shown in FIG. 13, DQ line 136, DQS line 152, DQ line 136 and DM line 316 (each indicated with a dashed rectangle) will be used to describe write-leveling for DRAM 116.

Figure 14:
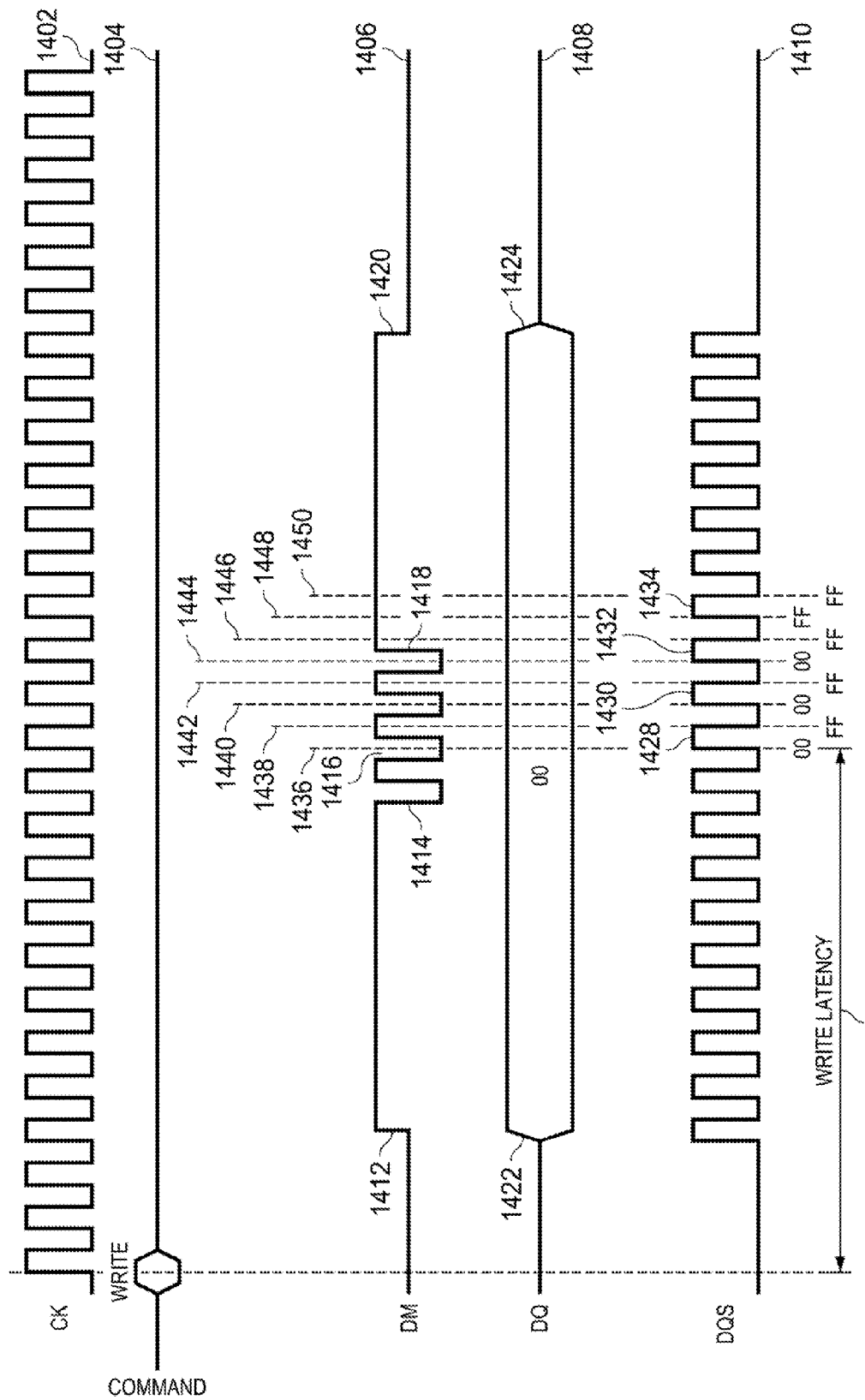
FIG. 14 illustrates a second writing sequence of the DRAM discussed with reference to FIG. 13, for the second stage of a two-stage write-leveling system and method in accordance with aspects of the present invention.

FIG. 14 illustrates a second writing sequence of DRAM 116 for the second stage of a two-stage write-leveling system and method in accordance with aspects of the present invention. For purposes of discussion, in this example, let the flight-time skew of DRAM 116 be one clock cycle, similar to the example as discussed above with reference to FIG. 4.

With additional reference to FIG. 3, FIG. 14 includes a CK signal 1402 provided to DRAM 116 via CK line 124 (after having traveled through extended paths indicated by sections 174, 176, 178, 180 and 182), a command signal 1404, a DM signal 1406 provided to DRAM 116 via DM line 316, a DQ signal 1408 provided to DRAM 116 via DQ line 136 and a DQS signal 1410 provided to DRAM 116 via DQS line 152.

Command signal 1404 corresponds to a command for writing or retrieving data as instructed by a processor (not shown), as associated signal line 122. Again, as discussed above with reference to command line 904 of FIG. 9, in the second stage of write-leveling, a command line is used to issue write and read commands to a respective DRAM. In the second state of write-leveling, data is written to a respective DRAM twice and is read back once. So during second stage write-leveling, two write commands and one read command will be issued. In this example, only the write commands are shown and the read commands are not. For this reason, command line 1404 is low.

DM signal 1406 includes a falling a non-writing area bounded by an edge 1412 and an edge 1414, a writing area 1416 bounded by edge 1414 and an edge 1418 and another non-writing area bounded by edge 1418 and an edge 1420. DQ signal 1408 includes an area bounded by an edge 1422 and an edge 1424. DQS signal 1410 includes a plurality of pulses, which include pulse 1428, pulse 1430, pulse 1432 and pulse 1434.

With reference to FIG. 13, DQS signal 1408 is provided by DQS signal generating portion 606. Similar to the DQ data, DQS signal generating portion 606 provides DQS signal 1410 to DRAM 116 for a sufficient number of clock cycles. In this example, DQS signal 1410 is provided for the same period as DQ signal 1408. Providing the data for this extended period ensures that data will be written to DRAM 116 even if by the first write-leveling stage discussed above with reference to FIG. 7, the DQS signal is not aligned with correct CK signal.

As discussed above, in this second writing sequence, the DM bit is toggled. In this example, with reference to FIG. 13. DM signal 1406 is provided by controlling portion 602. Controlling portion 602 provides non-masking DM signal 1406 to DRAM 116 that, when DM is low, start well before the write latency determined in the first writing sequence discussed above with reference to FIG. 9. In this case, the write latency is indicated by double arrow 1426.

Starting at edge 1414, DM signal 1406 is toggled for every edge of DQS signal 1410. Accordingly, DM signal 1406 enables writing of "00" data from DQ data 1408 for times shown by dotted lines 1436, 1440 and 1444. Further, DM signal 1406 is masking data from DQ data 1408 for times shown by dotted lines 1438, 1442, 1446, 1448 and 1450.

With this arrangement, DQ data 00 within DQ signal 1408 is essentially "waiting at the door" of DRAM 116. Data is masked when DM signal 1406 is high. At time shown by dotted lines 1436, 1440 and 1044, DM signal 1406 is low, which means that data is not masked. As such, whatever data is available on DQ signal 1408 will be written to DRAM 116. DQS signal 1410 actuates DRAM 116 to write data provided by DQ signal 1408, so long as DRAM 116 is not masked by DM signal 1406. In this manner, DRAM 116 writes DQ data 00 for times shown by dotted lines 1436, 1440 and 1442, which occurs after a write latency period indicated by double arrow 1426. Rising edges of pulses 1428, 1430 and 1432 of DQS signal 1410 correspond to the times when data 00 is provided to DRAM 116 via DQ signal 1408, an actuating rising edge of a DQS pulse is provided to DRAM 116 via DQS signal 1410 and a data mask is provided to DRAM 116 via DM signal 1406. Providing the data for this extended period ensures that data will be written to DRAM 116 even if by the first write-leveling stage discussed above with reference to FIG. 7, the DQS signal is not aligned with correct CK signal.

In this example, the previously stored data FF remains in DRAM 116 for the times shown by dotted lines 1438, 1442, 1446, 1448 and 1450. The final data stored in DRAM 116 is 00 FF 00 FF 00 FF FF FF.

The stored data in DRAM 116 is then read by delay determining portion 610 via DQ line 136. Adjustment portion 612 determines that because the data read from DRAM 116 includes repeating values FF and FF at the end of the data string, then there is adjustment needed to account for a flight time skew of one cycle.

Accordingly, for DRAM 116, a DQS signal provided by DQS signal generating portion 606 via DQS line 152 will be aligned with a CK signal provided by CK line 124 from clock signal generating portion 604 in a manner similar to that discussed above with reference to FIG. 4.

Now the situation of flight-time skew of two cycles will be discussed.

For purposes of discussion, presume that DRAM 118 will have a flight-time skew of one cycle. Aspects of the present invention to determine and address the flight-time skew of one cycle will be described with additional reference to FIGS. 15 and 16.

Figure 15:
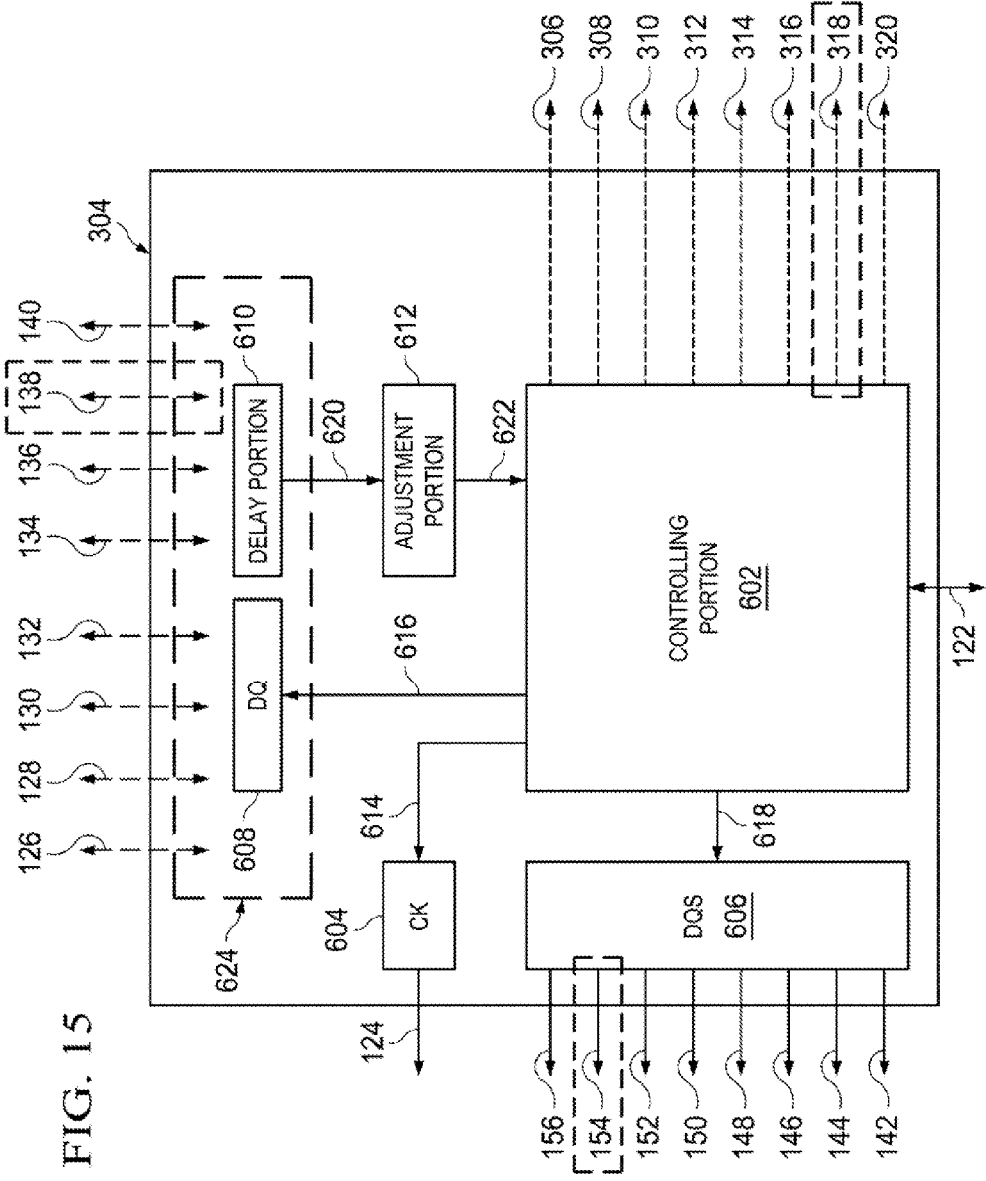
FIG. 15 illustrates another detailed view of an example of the controller of FIG. 3.

FIG. 15 illustrates a detailed view of an example of controller 304 of FIG. 3. FIG. 15 differs from FIG. 13 in that in FIG. 15, write-leveling to adjust for flight-time skew associated with DRAM 118 will be discussed. Accordingly, as shown in FIG. 15, DQ line 138, DQS line 154, DQ line 138 and DM line 318 (each indicated with a dashed rectangle) will be used to describe write-leveling for DRAM 118.

FIG. 15 illustrates a second writing sequence of DRAM 118 for the second stage of a two-stage write-leveling system and method in accordance with aspects of the present invention. For purposes of discussion, in this example, let the flight-time skew of DRAM 120 be for two clock cycles.

Figure 16:
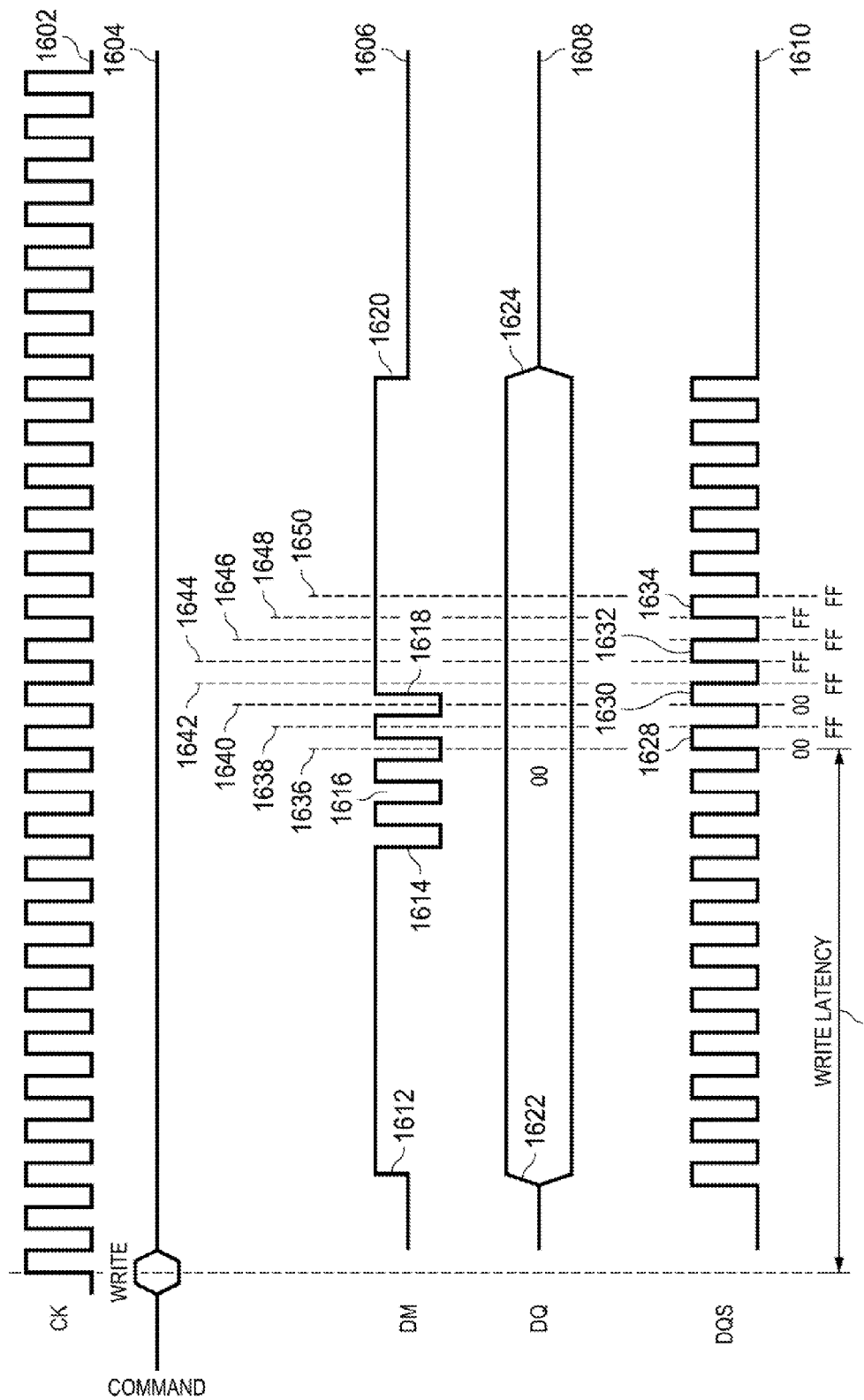
FIG. 16 illustrates a second writing sequence of the DRAM discussed with reference to FIG. 15, for the second stage of a two-stage write-leveling system and method in accordance with aspects of the present invention.

FIG. 16 illustrates a second writing sequence of DRAM 118 for the second stage of a two-stage write-leveling system and method in accordance with aspects of the present invention. For purposes of discussion, in this example, let the flight-time skew of DRAM 118 be two clock cycles, similar to the example as discussed above with reference to FIG. 4.

With additional reference to FIG. 3. FIG. 16 includes a CK signal 1602 provided to DRAM 118 via CK line 124 (after having traveled through extended paths indicated by sections 174, 176, 178, 180, 182 and 184), a command signal 1604, a DM signal 1606 provided to DRAM 118 via DM line 318, a DQ signal 1608 provided to DRAM 118 via DQ line 138 and a DQS signal 1610 provided to DRAM 118 via DQS line 154.

Command signal 1604 corresponds to a command for writing or retrieving data as instructed by a processor (not shown), as associated signal line 122. Again, as discussed above with reference to command line 904 of FIG. 9, in the second stage of write-leveling, a command line is used to issue write and read commands to a respective DRAM. In the second state of write-leveling, data is written to a respective DRAM twice and is read back once. So during second stage write-leveling, two write commands and one read command will be issued. In this example, only the write commands are shown and the read commands are not. For this reason, command signal 1604 is low.

DM signal 1606 includes a falling a non-writing area bounded by an edge 1612 and an edge 1614, a writing area 1616 bounded by edge 1614 and an edge 1618 and another non-writing area bounded by edge 1618 and an edge 1620. DQ signal 1608 includes an area bounded by an edge 1622 and an edge 1624. DQS signal 1610 includes a plurality of pulses, which include pulse 1628, pulse 1630, pulse 1632 and pulse 1634.

With reference to FIG. 15, DQS signal 1608 is provided by DQS signal generating portion 606. Similar to the DQ data, DQS signal generating portion 606 provides DQS signal 1610 to DRAM 118 for a sufficient number of clock cycles. In this example, DQS signal 1610 is provided for the same period as DQ signal 1608. Providing the data for this extended period ensures that data will be written to DRAM 118 even if by the first write-leveling stage discussed above with reference to FIG. 7, the DQS signal is not aligned with correct CK signal.

As discussed above, in this second writing sequence, the DM bit is toggled. In this example, with reference to FIG. 15, DM signal 1606 is provided by controlling portion 602. Controlling portion 602 provides non-masking DM signal 1606 to DRAM 118 that, when DM is low, start well before the write latency determined in the first writing sequence discussed above with reference to FIG. 9. In this case, the write latency is indicated by double arrow 1626.

Starting at edge 1614, DM signal 1606 is toggled for every edge of DQS signal 1610. Accordingly, DM signal 1606 enables writing of "00" data from DQ data 1608 for times shown by dotted lines 1636 and 1640. Further, DM signal 1606 is masking data from DQ data 1608 for times shown by dotted lines 1638, 1642, 1644, 1646, 1648 and 1650.

With this arrangement, DQ data 00 within DQ signal 1608 is essentially "waiting at the door" of DRAM 118. Data is masked when DM signal 1606 is high. At time shown by dotted lines 1636 and 1640, DM signal 1606 is low, which means that data is not masked. As such, whatever data is available on DQ signal 1608 will be written to DRAM 118. DQS signal 1610 actuates DRAM 118 to write data provided by DQ signal 1608, so long as DRAM 118 is not masked by DM signal 1606. In this manner, DRAM 118 writes DQ data 00 for times shown by dotted lines 1636 and 1640, which occurs after a write latency period indicated by double arrow 1626. Rising edges of pulses 1628 and 1630 of DQS signal 1610 correspond to the times when data 00 is provided to DRAM 118 via DQ signal 1608, an actuating rising edge of a DQS pulse is provided to DRAM 118 via DQS signal 1610 and data mask is provided to DRAM 118 via DM signal 1606. Providing the data for this extended period ensures that data will be written to DRAM 118 even if by the first write-leveling stage discussed above with reference to FIG. 7, the DQS signal is not aligned with correct CK signal.

In this example, the previously stored data FF remains in DRAM 118 for the times shown by dotted lines 1638, 1642, 1644, 1646, 1648 and 1650. The final data stored in DRAM 118 is 00 FF 00 FF FF FF FF FF.

The stored data in DRAM 118 is then read by delay determining portion 610 via DQ line 136. Adjustment portion 612 determines that because the data read from DRAM 118 includes two sets of repeating values FF and FF at the end of the data string, then there is adjustment needed to account for a flight time skew of two cycles.

Accordingly, for DRAM 118, a DQS signal provided by DQS signal generating portion 606 via DQS line 152 will be aligned with a CK signal provided by CK line 124 from clock signal generating portion 604 in a manner similar to that discussed above with reference to FIG. 4, but for two cycles.

Now the situation of flight-time skew of three cycles will be discussed.

For purposes of discussion, presume that DRAM 120 will have a flight-time skew of one cycle. Aspects of the present invention to determine and address the flight-time skew of one cycle will be described with additional reference to FIGS. 17 and 18.

Figure 17:
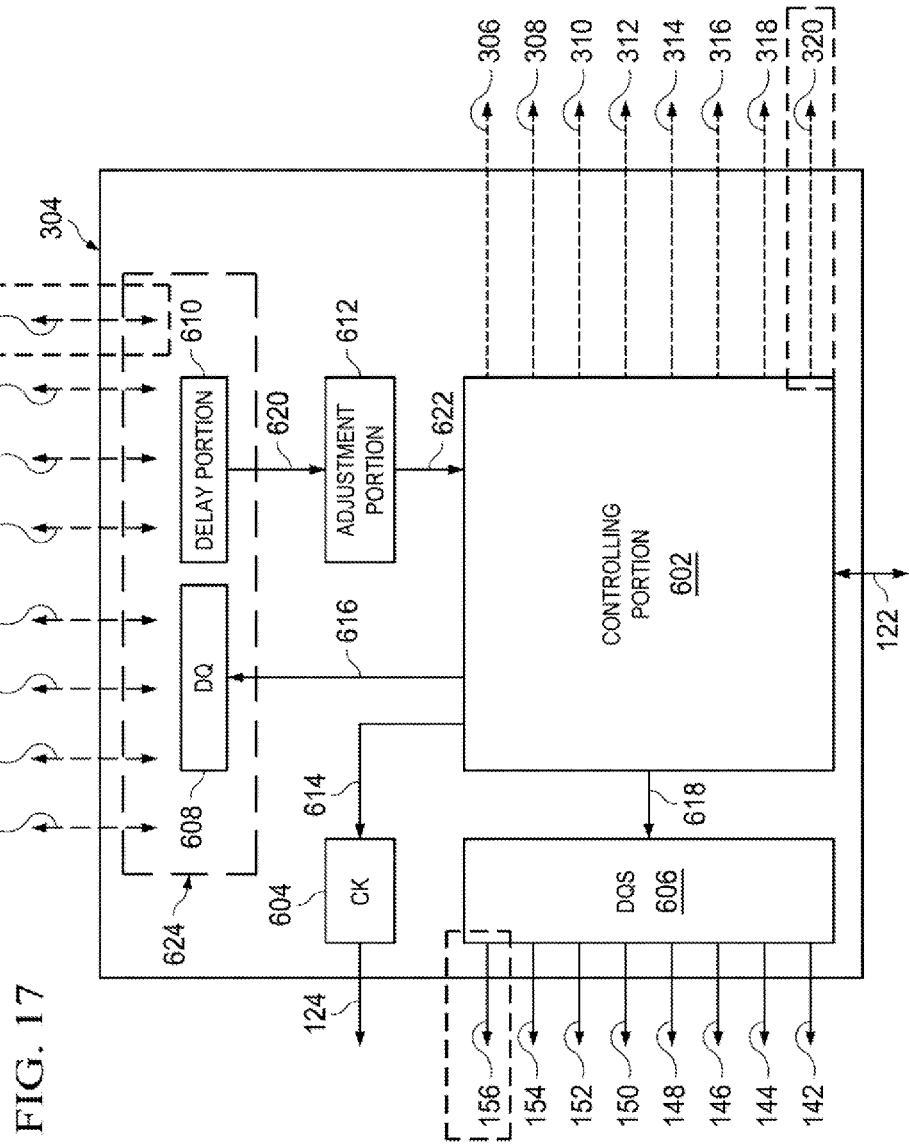
FIG. 17 illustrates a detailed view of an example of the controller of FIG. 3.

FIG. 17 illustrates a detailed view of an example of controller 304 of FIG. 3. FIG. 17 differs from FIG. 15 in that in FIG. 17, write-leveling to adjust for flight-time skew associated with DRAM 120 will be discussed. Accordingly, as shown in FIG. 17, DQ line 140. DQS line 156, DQ line 140 and DM line 320 (each indicated with a dashed rectangle) will be used to describe write-leveling for DRAM 120.

FIG. 17 illustrates a second writing sequence of DRAM 120 for the second stage of a two-stage write-leveling system and method in accordance with aspects of the present invention. For purposes of discussion, in this example, let the flight-time skew of DRAM 120 be for three clock cycles.

Figure 18:
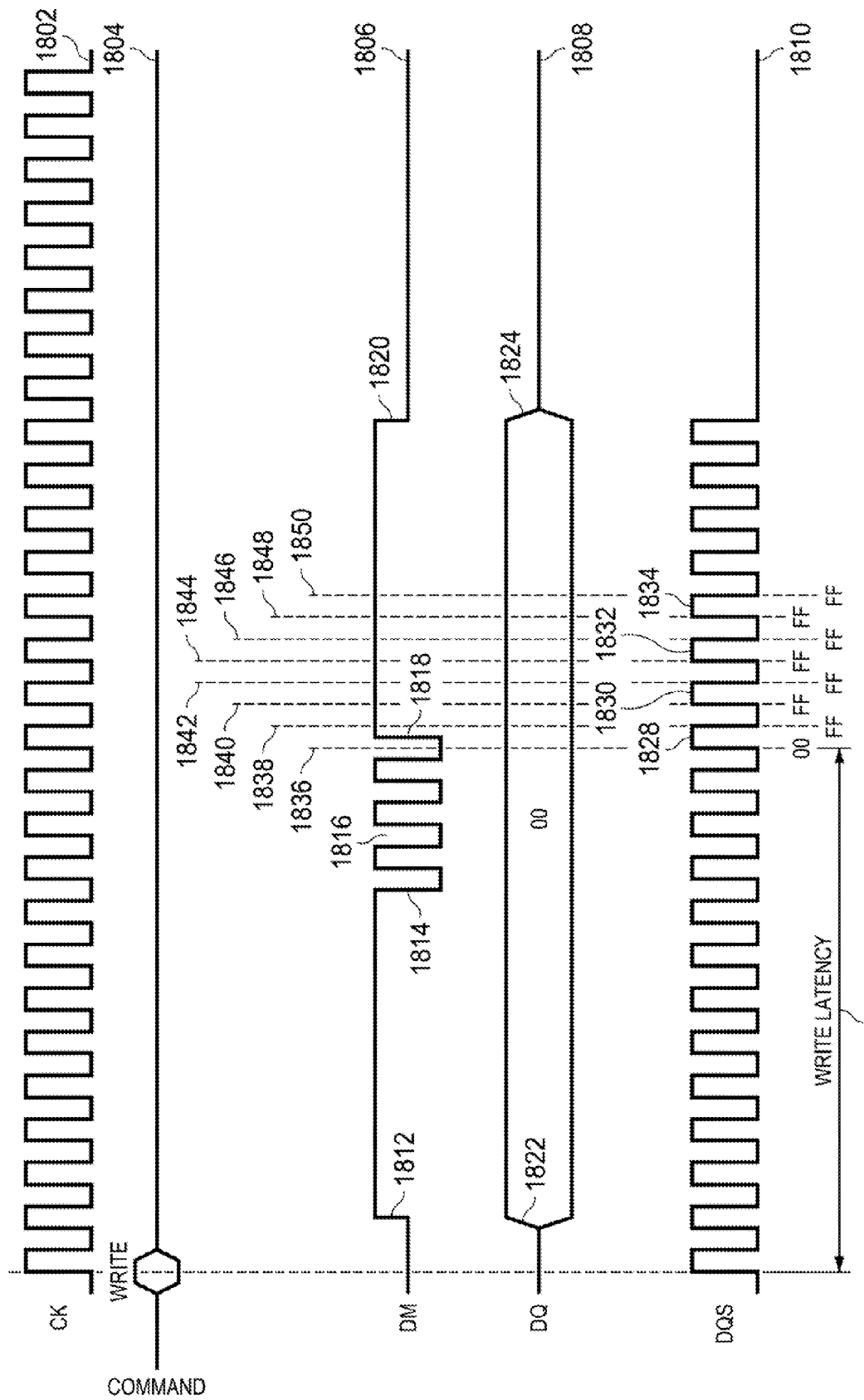
FIG. 18 illustrates a second writing sequence of the DRAM discussed above with reference to FIG. 17, for the second stage of a two-stage write-leveling system and method in accordance with aspects of the present invention.

FIG. 18 illustrates a second writing sequence of DRAM 120 for the second stage of a two-stage write-leveling system and method in accordance with aspects of the present invention. For purposes of discussion, in this example, let the flight-time skew of DRAM 120 be three clock cycles, similar to the example as discussed above with reference to FIG. 4.

With additional reference to FIG. 3, FIG. 18 includes a CK signal 1802 provided to DRAM 120 via CK line 124 (after having traveled through extended paths indicated by sections 174, 176, 178, 180, 182, 184 and 186), a command signal 1804, a DM signal 1806 provided to DRAM 120 via DM line 320, a DQ signal 1808 provided to DRAM 120 via DQ line 140 and a DQS signal 1810 provided to DRAM 120 via DQS line 156.

Command signal 1804 corresponds to a command for writing or retrieving data as instructed by a processor (not shown), as associated signal line 122. Again, as discussed above with reference to command line 904 of FIG. 9, in the second stage of write-leveling, a command line is used to issue write and read commands to a respective DRAM. In the second state of write-leveling, data is written to a respective DRAM twice and is read back once. So during second stage write-leveling, two write commands and one read command will be issued. In this example, only the write commands are shown and the read commands are not. For this reason, command signal 1804 is low.

DM signal 1806 includes a falling a non-writing area bounded by an edge 1812 and an edge 1814, a writing area 1816 bounded by edge 1814 and an edge 1818 and another non-writing area bounded by edge 1818 and an edge 1820. DQ signal 1808 includes an area bounded by an edge 1822 and an edge 1824. DQS signal 1810 includes a plurality of pulses, which include pulse 1828, pulse 1830, pulse 1832 and pulse 1834.

With reference to FIG. 17, DQS signal 1808 is provided by DQS signal generating portion 606. Similar to the DQ data, DQS signal generating portion 606 provides DQS signal 1810 to DRAM 120 for a sufficient number of clock cycles. In this example, DQS signal 1810 is provided for the same period as DQ signal 1808. Providing the data for this extended period ensures that data will be written to DRAM 120 even if by the first write-leveling stage discussed above with reference to FIG. 7, the DQS signal is not aligned with correct CK signal.

As discussed above, in this second writing sequence, the DM bit is toggled. In this example, with reference to FIG. 17. DM signal 1806 is provided by controlling portion 602. Controlling portion 602 provides non-masking DM signal 1806 to DRAM 120 that, when DM is low, start well before the write latency determined in the first writing sequence discussed above with reference to FIG. 9. In this case, the write latency is indicated by double arrow 1826.

Starting at edge 1814, DM signal 1806 is toggled for every edge of DQS signal 1810. Accordingly, DM signal 1806 enables writing of "00" data from DQ data 1808 for the time shown by dotted line 1836. Further, DM signal 1806 is masking data from DQ data 1808 for times shown by dotted lines 1838, 1840, 1842, 1844, 1846, 1848 and 1850.

With this arrangement, DQ data (X) within DQ signal 1808 is essentially "waiting at the door" of DRAM 120. Data is masked when DM signal 1806 is high. At time shown by dotted line 1836, DM signal 1806 is low, which means that data is not masked. As such, whatever data is available on DQ signal 1808 will be written to DRAM 120. DQS signal 1810 actuates DRAM 120 to write data provided by DQ signal 1808, so long as DRAM 120 is not masked by DM signal 1806. In this manner, DRAM 120 writes DQ data 00 for the time shown by dotted lines 1836, which occurs after a write latency period indicated by double arrow 1826. Rising edge of pulse 1828 of DQS signal 1810 corresponds to the time when data 00 is provided to DRAM 120 via DQ signal 1808, an actuating rising edge of a DQS pulse is provided to DRAM 120 via DQS signal 1810 and a data mask is provided to DRAM 120 via DM signal 1806. Providing the data for this extended period ensures that data will be written to DRAM 120 even if by the first write-leveling stage discussed above with reference to FIG. 7, the DQS signal is not aligned with correct CK signal.

In this example, the previously stored data FF remains in DRAM 120 for the times shown by dotted lines 1838, 1840, 1842, 1844, 1846, 1848 and 1850. The final data stored in DRAM 120 is 00 FF FF FF FF FF FF FF.

The stored data in DRAM 120 is then read by delay determining portion 610 via DQ line 136. Adjustment portion 612 determines that because the data read from DRAM 120 includes three sets of repeating values FF and FF at the end of the data string, then there is adjustment needed to account for a flight time skew of three cycles.

Accordingly, for DRAM 120, a DQS signal provided by DQS signal generating portion 606 via DQS line 152 will be aligned with a CK signal provided by CK line 124 from clock signal generating portion 604 in a manner similar to that discussed above with reference to FIG. 4, but for three cycles.

The conventional methods of write-leveling fail to address situations where the DQS signal arrives after the CK signal. Further, conventional methods of write-leveling fail to address situations where the difference between the DQS delay and the CK delay is more than one clock cycle.

A write-leveling system and method in accordance with aspects of the present invention enables write-leveling in situations where: the flight-time skew is up to one clock cycle; the flight-time skew is negative; and the flight time skew is greater than one clock cycle.

A write-leveling system and method in accordance with aspects of the present invention provides a two-stage leveling.

In the first stage, the absolute skew between a DQS rising edge and the CK rising edge is determined. In the second stage, it is determined which CK pulse was aligned with the DQS pulse in the first stage and then write-leveling is performed to align a DQS rising edge with the correct CK rising edge.

In an example embodiment, controller 304 includes DQS signal generating portion 606, clock signal generating portion 604, delay determining portion 610, adjustment portion 612 and controlling portion 602. DQS signal generating portion 606 provides DQS signal to the DRAM at a first time, for example as shown as destination DQS signal 508 in FIG. 5. Clock signal generating portion 604 provides a clock signal to the DRAM. Delay determining portion operable to receive a delay signal from the DRAM and to generate a delay value based on the received signal. This is discussed above, for example, with reference to read signal 132 in FIG. 6, and wherein the adjustment value corresponds to the delay value in signal 620. Adjustment portion 612 generates an adjustment value based on the delay value. For example, the adjustment value from adjustment portion 612 may be an indication to controlling portion 602 that the flight-time skew is negative by one clock pulse, is zero, or is one, two or three clock pulses. DQS signal generating portion 606 also provides a second DQS signal to the DRAM, for example as shown as aligned DQS signal 510 in FIG. 5. Controlling portion 602 instructs DQS signal generating portion 606, for example via signal 618, to provide the second DQS signal at a second time based on the adjustment value. Finally, the delay signal corresponds to the DRAM having received the DQS signal prior to receiving the clock signal, which means that the flight-time skew is negative.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The example embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A system for use with a DRAM, said system comprising:
   a DQS signal generating portion operable to provide a DQS signal to the DRAM at a first time;
   a clock signal generating portion operable to provide a clock signal to the DRAM;
   a delay determining portion operable to receive a delay signal from the DRAM and to generate a delay value based on the received signal;
   an adjustment portion operable to generate an adjustment value based on the delay value; and
   a controlling portion,
   wherein said DQS signal generating portion is operable to provide a second DQS signal to the DRAM,
   wherein said controlling portion is operable to instruct said DQS signal generating portion to provide the second DQS signal at a second time based on the adjustment value, and
   wherein the delay signal corresponds to the DRAM having received the DQS signal prior to receiving the clock signal.

2. A system for use with a DRAM, said system comprising:
   a DQS signal generating portion operable to provide a first DQS signal to the DRAM for a first time period and to provide a second DQS signal to the DRAM for a second time period;
   a clock signal generating portion operable to provide a clock signal to the DRAM;
   a DQ data generating portion operable to provide first DQ data to the DRAM during a third time period and to provide second DQ data to the DRAM during a fourth time period;
   a delay determining portion operable to read data from the DRAM after the fourth time period and to generate a delay value based on the received data;
   an adjustment portion operable to generate an adjustment value based on the delay value; and
   a controlling portion,
   wherein said DQS signal generating portion is operable to provide a third DQS signal to the DRAM,
   wherein said controlling portion is operable to instruct said DQS signal generating portion to provide the third DQS signal at a third time based on the adjustment value.

3. The system of claim 2, wherein said controlling portion is operable to instruct said DQS signal generating portion to provide the first DQ data to the DRAM during the third time period as a single bit having a first value for a plurality of clock cycles of the clock signal so as to store a string of bits, each having the first value, into the DRAM.

4. The system of claim 3, wherein said controlling portion is operable to instruct said DQS signal generating portion to provide the second DQ data to the DRAM during the fourth time period as a single bit having a second value, in alternating clock cycles of the plurality of clock cycles of the clock signal so as to store a second string of bits into the DRAM by rewriting alternating bits, of the string of bits, with the second value.

5. The system of claim 4,
   wherein said delay determining portion is operable to the read data from the DRAM after the fourth time period as the second string of bits,
   wherein said delay determining portion is operable generate the delay value as a zero delay value when the second string of bits does not include any consecutive bits of the first value,
   wherein said adjustment portion is operable to generate the adjustment value as a zero adjustment value when the delay value is the zero delay value, and
   wherein the zero adjustment value indicates that the first DQS signal is properly aligned with the clock signal at the DRAM.

6. The system of claim 4,
   wherein said delay determining portion is operable to the read data from the DRAM after the fourth time period as the second string of bits,
   wherein said delay determining portion is operable generate the delay value as a negative delay value when the first two consecutive bits of the second string of bits are of the first value,
   wherein said adjustment portion is operable to generate the adjustment value as a negative adjustment value when the delay value is the negative delay value, and
   wherein the negative adjustment value indicates that the first DQS signal leads the clock signal at the DRAM.

7. The system of claim 4,
   wherein said delay determining portion is operable to the read data from the DRAM after the fourth time period as the second string of bits,
   wherein said delay determining portion is operable generate the delay value as a positive delay value when the last two consecutive bits of the second string of bits are of the first value,
   wherein said adjustment portion is operable to generate the adjustment value as a positive adjustment value when the delay value is the positive delay value, and
   wherein the positive adjustment value indicates that the clock signal leads the DQS signal at the DRAM.

8. A method of calibrating a DRAM for flight-time skew, said method comprising:
   providing, via a DQS signal generating portion, a DQS signal to the DRAM at a first time;
   providing, via a clock signal generating portion, a clock signal to the DRAM;
   receiving, via a delay determining portion, a delay signal from the DRAM;

generating, via the delay determining portion, a delay value based on the received signal;

generating, via an adjustment portion, an adjustment value based on the delay value;

providing, via the DQS signal generating portion, a second DQS signal to the DRAM; and instructing, via a controlling portion, instruct the DQS signal generating portion to provide the second DQS signal at a second time based on the adjustment value, wherein the delay signal corresponds to the DRAM having received the DQS signal prior to receiving the clock signal.

9. A method of calibrating a DRAM for flight-time skew, said method comprising:

providing, via a DQS signal generating portion, a first DQS signal to the DRAM for a first time period;

providing, via the DQS signal generating portion, a second DQS signal to the DRAM for a second time period;

providing, via a clock signal generating portion, a clock signal to the DRAM;

providing, via a DQ data generating portion, first DQ data to the DRAM during a third time period;

providing, via the DQ data generating portion, second DQ data to the DRAM during a fourth time period;

reading, via a delay determining portion, data from the DRAM after the fourth time period;

generating, via the delay determining portion, a delay value based on the received data;

generating, via an adjustment portion, an adjustment value based on the delay value;

providing, via the DQS signal generating portion, a third DQS signal to the DRAM; and instructing, via a controlling portion, the DQS signal generating portion to provide the third DQS signal at a third time based on the adjustment value.

10. The method of claim 9, wherein said instructing, via a controlling portion, the DQS signal generating portion to provide the third DQS signal at a third time based on the adjustment value comprises instructing, via the controlling portion, the DQS signal generating portion to provide the third DQS signal as a single bit having a first value for a plurality of clock cycles of the clock signal so as to store a string of bits, each having the first value, into the DRAM.

11. The method of claim 10, wherein said instructing, via a controlling portion, the DQS signal generating portion to provide the third DQS signal at a third time based on the adjustment value comprises instructing, via the controlling portion, the DQS signal generating portion to provide the third DQS signal as a single bit having a second value, in alternating clock cycles of the plurality of clock cycles of the clock signal so as to store a second string of bits into the DRAM by rewriting alternating bits, of the string of bits, with the second value.

12. The method of claim 11, wherein said reading, via a delay determining portion, data from the DRAM after the fourth time period comprises reading data from the DRAM as the second string of bits, wherein said generating, via the delay determining portion, a delay value based on the received data comprises generating the delay value as a zero delay value when the second string of bits does not include any consecutive bits of the first value, wherein said generating, via an adjustment portion, an adjustment value based on the delay value comprises generating the adjustment value as a zero adjustment value when the delay value is the zero delay value, and wherein the zero adjustment value indicates that the first DQS signal is properly aligned with the clock signal at the DRAM.

13. The method of claim 11, wherein said reading, via a delay determining portion, data from the DRAM after the fourth time period comprises reading data from the DRAM as the second string of bits, wherein said generating, via the delay determining portion, a delay value based on the received data comprises generating the delay value as a negative delay value when the first two consecutive bits of the second string of bits are of the first value, wherein said generating, via an adjustment portion, an adjustment value based on the delay value comprises generating the adjustment value as a negative adjustment value when the delay value is the negative delay value, and wherein the negative adjustment value indicates that the first DQS signal leads the clock signal at the DRAM.

14. The method of claim 1, wherein said reading, via a delay determining portion, data from the DRAM after the fourth time period comprises reading data from the DRAM as the second string of bits, wherein said generating, via the delay determining portion, a delay value based on the received data comprises generating the delay value as a positive delay value when the last two consecutive bits of the second string of bits are of the first value, wherein said generating, via an adjustment portion, an adjustment value based on the delay value comprises generating the adjustment value as a positive adjustment value when the delay value is the positive delay value, and wherein the positive adjustment value indicates that the clock signal leads the DQS signal at the DRAM.

* * * * *